US011545811B2

(12) United States Patent
Avci et al.

(10) Patent No.: US 11,545,811 B2
(45) Date of Patent: Jan. 3, 2023

(54) LASER DRIVER DESIGNS TO REDUCE OR ELIMINATE FAULT LASER FIRING

(71) Applicant: Analog Devices International Unlimited Company, Limerick (IE)

(72) Inventors: Celal Avci, Istanbul (TR); Yalcin Alper Eken, Istanbul (TR); Ercan Kaymaksut, Istanbul (TR); Shawn S. Kuo, Arlington, MA (US); Atilim Ergul, Istanbul (TR); Mehmet Arda Akkaya, Istanbul (TR)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 165 days.

(21) Appl. No.: 16/590,892

(22) Filed: Oct. 2, 2019

(65) Prior Publication Data
US 2021/0104866 A1 Apr. 8, 2021

(51) Int. Cl.
*H01S 5/042* (2006.01)
*H01S 5/026* (2006.01)
(Continued)

(52) U.S. Cl.
CPC ............ *H01S 5/042* (2013.01); *H01S 5/0261* (2013.01); *H01S 5/06825* (2013.01);
(Continued)

(58) Field of Classification Search
CPC ............................ H01S 5/0428; H01S 5/06825
See application file for complete search history.

(56) References Cited

U.S. PATENT DOCUMENTS 5,418,704 A 5/1995 Hua et al.
5,736,881 A * 4/1998 Ortiz .................. H05B 45/3725
327/515
(Continued)

FOREIGN PATENT DOCUMENTS

CN 106549301 A 3/2017
DE 102006036167 A1 2/2008
(Continued)

OTHER PUBLICATIONS

Electronics Tutorials (LR series circuit, <https://www.electronics-tutorials.ws/inductor/lr-circuits.html>, May 9, 2017, retrieved from Internet Archive Wayback Machine <https://web.archive.org/web/20170509013957/https://www.electronics-tutorials.ws/inductor/lr-circuits.html> on Apr. 6, 2022) (Year: 2017).*
(Continued)

*Primary Examiner* — Tod T Van Roy
(74) *Attorney, Agent, or Firm* — Akona IP

(57) ABSTRACT

Laser driver designs that aim to reduce or eliminate the problem of fault laser firing are disclosed. Various laser driver designs presented herein are based on providing a current dissipation path that is configured to start providing a resistance for dissipating at least a portion, but preferably substantially all, of the negative current from the laser diode. Dissipating at least a portion of the negative current may decrease the unintentional increase of the voltage at the input to the laser diode and, therefore, reduce the likelihood that fault laser firing will occur. A control logic may be used to control the timing of when the current dissipation path is activated (i.e., provides the resistance to dissipate the negative current from the laser diode) and when it is deactivated.

18 Claims, 15 Drawing Sheets

(51) Int. Cl.
*H01S 5/068* (2006.01)
*H03K 17/687* (2006.01)
*H01S 5/062* (2006.01)

(52) U.S. Cl.
CPC ......... *H01S 5/0428* (2013.01); *H01S 5/06216* (2013.01); *H03K 17/6871* (2013.01); *H03K 2217/0063* (2013.01); *H03K 2217/0072* (2013.01)

(56) References Cited

U.S. PATENT DOCUMENTS

| | | | | |
|---|---|---|---|---|
| 6,697,402 | B2* | 2/2004 | Crawford | H01S 5/042 |
| | | | | 372/38.03 |
| 7,545,839 | B2* | 6/2009 | Giorgi | H01S 5/042 |
| | | | | 372/38.07 |
| 8,207,711 | B2 | 6/2012 | Crawford et al. | |
| 9,100,019 | B2 | 8/2015 | Akiyama | |
| 9,570,997 | B2* | 2/2017 | Theiler | H05B 45/46 |
| 10,158,211 | B2 | 12/2018 | Barnes | H01S 3/10 |
| 10,285,229 | B2 | 5/2019 | Wang et al. | |
| 10,574,026 | B2* | 2/2020 | Mignoli | G01S 7/484 |
| 10,903,621 | B2* | 1/2021 | Stern | H01S 5/0428 |
| 2003/0016711 | A1* | 1/2003 | Crawford | H01S 5/042 |
| | | | | 372/38.02 |
| 2009/0200953 | A1 | 8/2009 | King | |
| 2010/0283322 | A1* | 11/2010 | Wibben | H02M 3/158 |
| | | | | 307/31 |
| 2014/0211192 | A1* | 7/2014 | Grootjans | H02M 7/42 |
| | | | | 356/5.01 |
| 2014/0269799 | A1* | 9/2014 | Ortiz | H01S 5/0428 |
| | | | | 372/38.02 |
| 2015/0061530 | A1 | 3/2015 | Kang | |
| 2017/0040770 | A1* | 2/2017 | Gyoten | H01S 5/0428 |
| 2017/0085057 | A1* | 3/2017 | Barnes | H01S 5/0428 |
| 2018/0031357 | A1 | 2/2018 | Rastegar et al. | |
| 2018/0188360 | A1* | 7/2018 | Berger | G01S 17/06 |
| 2019/0025406 | A1* | 1/2019 | Krelboim | H01S 5/062 |
| 2019/0229493 | A1* | 7/2019 | Stern | H01S 5/0428 |
| 2021/0021098 | A1* | 1/2021 | Kaymaksut | H01S 5/0428 |
| 2021/0066885 | A1* | 3/2021 | Kuo | H01S 5/0608 |
| 2021/0098965 | A1* | 4/2021 | Crawford | H02J 7/345 |
| 2021/0104866 | A1* | 4/2021 | Avci | H03K 17/164 |

FOREIGN PATENT DOCUMENTS

| | | |
|---|---|---|
| KR | 20150026470 A | 3/2015 |
| WO | 2016030954 A1 | 3/2016 |

OTHER PUBLICATIONS

Electronics Tutorials (RC discharge circuit, <https://www.electronics-tutorials.ws/rc/rc_2.html>, May 9, 2017, retrieved from Internet Archive Wayback Machine https://web.archive.org/web/20170509050645/https://www.electronics-tutorials.ws/rc/rc_2.html on Apr. 6, 2022) (Year: 2017).*
English Translation of Abstract, Description and Claims for Foreign Reference DE102006036167, 20 pages.
English Translation of Abstract, Description and Claims for Foreign Reference WO201603954, 34 pages.

* cited by examiner

LASER DRIVER DESIGNS TO REDUCE OR ELIMINATE FAULT LASER FIRING

TECHNICAL FIELD OF THE DISCLOSURE

The present disclosure relates generally to electronics and, more specifically, to laser drivers.

BACKGROUND

Laser drivers are electronic circuits that provide a current that is used to power a laser diode (also commonly referred to simply as a "laser"), i.e., to cause it to emit light. A pulse of current provided from a laser driver to a laser diode causes the laser diode to emit a pulse of light.

Laser drivers are used in a variety of applications. In some applications, fault laser firing, a phenomenon of a laser diode emitting light at times when it is not supposed to, is highly undesirable or altogether unacceptable. Light detection and ranging (LIDAR) systems are one example of such applications. LIDAR systems can be used with airplanes, automobiles, or in industrial settings, where laser pulses are transmitted and received to, e.g., detect a distance between a system and an object.

Providing laser drivers that can reduce or eliminate fault laser firing is not trivial and improvements in that respect would be desirable.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
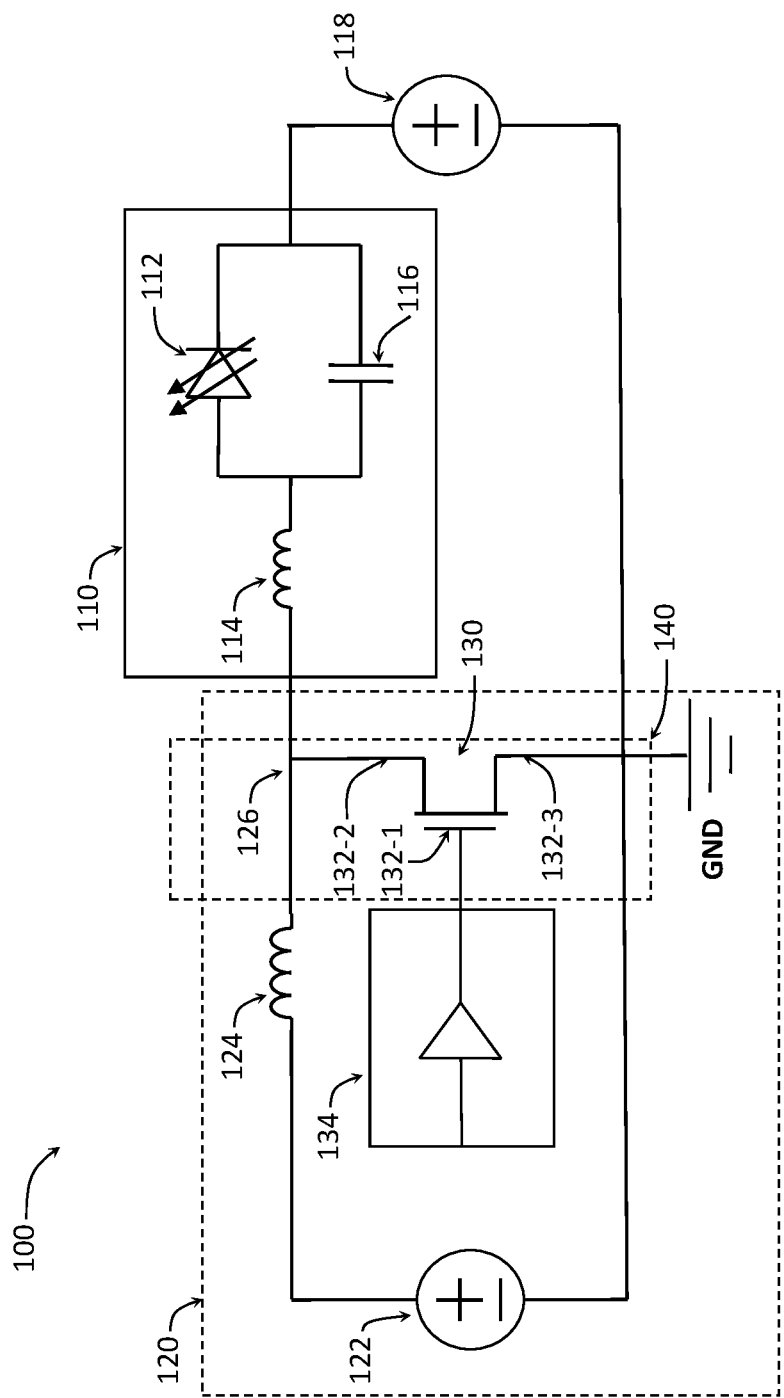
FIG. 1 is a schematic diagram of a conventional laser system with a laser driver and a laser diode.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

Some aspects of the present disclosure relate to various laser driver designs that aim to reduce or eliminate the problem of fault laser firing in laser diodes driven by the laser drivers. Various laser driver designs presented herein are based on providing a current dissipation path that is configured to start providing a resistance for dissipating at least a portion (but preferably substantially all) of a current from (i.e., provided by, or flowing from) a laser diode (i.e., a negative current because this current moves away from the laser diode). Dissipating at least a portion of the negative current may decrease the unintentional increase of the voltage at the input to the laser diode and, therefore, reduce the likelihood that fault laser firing will occur. A control logic may be used to control the timing of various operations of the laser drivers with negative current dissipation paths as described herein. In particular, a control logic may be used to control when the current dissipation path is activated (i.e., provides the resistance to dissipate the negative current from the laser diode) and when it is deactivated (i.e., does not provide the resistance to dissipate the negative current from the laser diode).

Other aspects of the present disclosure relate to systems, e.g., LIDAR systems or any other systems that transmit laser light, which may include such laser drivers, as well as methods for operating such laser drivers and systems.

As will be appreciated by one skilled in the art, aspects of the present disclosure, in particular aspects of laser drivers with controllable current dissipation paths as proposed herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing laser light transmitters, LIDAR systems, and/or their controllers, etc.) or be stored upon manufacturing of these devices and systems. For example, the timing of various operations of the present disclosure, in particular the timing of when which ones of the switches described herein are in which state (e.g., when a given switch is on or off), may be controlled by a control logic. In some embodiments, such a control logic may be implemented as an algorithm or a computer program executed by one or more hardware processing units, e.g. one or more microprocessors, of one or more computers.

The following detailed description presents various descriptions of specific certain embodiments. However, the innovations described herein can be embodied in a multitude of different ways, for example, as defined and covered by the claims or select examples. In particular, while embodiments illustrated in the figures show various switches implemented as transistors, in particular, implemented as N-type metal-oxide-semiconductor (NMOS) transistors, a particular type of field-effect-transistors (FET), and while some embodiments may be described with reference to enhancement-mode FETs (i.e., transistors that are designed to be off (i.e., no current is flowing through the transistor) at zero gate voltage), principles described herein are not limited to such embodiments, and further variations and implementations are possible. In some embodiments, transistors described herein may be III-N based transistors (i.e., transistors that employ compound semiconductor materials with a first sub-lattice of at least one element from group III of the periodic table (e.g., Al, Ga, In) and a second sub-lattice of nitrogen (N) as channel materials), such as gallium nitride (GaN) based transistors, may be particularly advantageous for high frequency applications. In general, any of the switches in any embodiments of the present disclosure may be implemented as any suitable switch, e.g., a FET, a bipolar transistor, or a pin diode, or any other suitable device that may be in one of the plurality of states as described herein. For example, in some embodiments of the present disclosure, any of the switches described herein may be implemented as FETs, where any switch may be implemented either as an enhancement-mode FET or a depletion-mode FET (i.e., a transistor that is designed to be on (i.e., current is flowing through the transistor) at zero gate-source voltage). In other embodiments of the present disclosure, any of the switches described herein may be implemented as bipolar transistors, in which case a gate terminal for the FET implementations shown in the present figures would be replaced with a base terminal for the bipolar implementations, a drain terminal for the FET implementations shown in the present figures would be replaced with a collector terminal for the bipolar implementations, and a source terminal for the FET implementations shown in the present figures would be replaced with an emitter terminal for the bipolar implementations. Furthermore, in various embodiments of the present disclosure, each of the switches described herein may be implemented either as an N-type transistor (e.g., an NMOS transistor if the switch is implemented as a FET, or an NPN transistor if the switch is implemented as a bipolar transistor), or as a P-type transistor (e.g., a PMOS transistor if the switch is implemented as a FET, or a PNP transistor if the switch is implemented as a bipolar transistor).

Any of the principles and advantages discussed herein can be applied to other systems, devices, integrated circuits, electronic apparatus, methods, not just to the embodiments described herein. The elements and operations of the various embodiments described herein can be combined to provide further embodiments. The principles and advantages of the embodiments can be used in connection with any other systems, devices, integrated circuits, apparatus, or methods that could benefit from any of the teachings herein. Furthermore, it is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Other features and advantages of the disclosure will be apparent from the following description, the drawings, and the claims.

Fault Laser Firing in Conventional Laser Drivers

For purposes of illustrating laser driver circuits/designs proposed herein, it might be useful to first understand settings in which laser drivers may be used, as well as phenomena that may come into play when laser drivers are used to drive laser diodes. The following foundational information may be viewed as a basis from which the present disclosure may be properly explained. Such information is offered for purposes of explanation only and, accordingly, should not be construed in any way to limit the broad scope of the present disclosure and its potential applications.

A LIDAR system can include a transmitter and a receiver. The transmitter can generate pulses of light and transmit the pulses of light to an object. The light can be laser light. In particular, transmitters of LIDAR systems may include laser drivers configured to drive laser diodes to transmit the pulses of light. The receiver can receive and process light pulses reflected from the object in order to, e.g., detect a distance to the object.

FIG. 1 is a schematic diagram of a conventional laser system 100 with a laser diode 110 and a laser driver 120. The laser diode 110 may include a light-emitting element 112, a laser inductor 114, and a laser capacitor 116, connected to one another as shown in FIG. 1. In some embodiments, the laser driver 120 may be a resonant inductive laser driver. The laser system 100 further includes a supply voltage source 118, as shown in FIG. 1. The laser driver 120 may include a supply voltage source 122, providing voltage Vin, coupled to one end of a laser driver inductor 124 (referred to in the following as "the main inductor 124"). A switch 130, illustrated in the example of FIG. 1 as an NMOS FET 130 may be included in a path 140 (indicated in FIG. 1 with a dashed contour). In the following, the switch 130 is referred to as "the switching transistor 130." As shown in FIG. 1, the switching transistor 130 is a 3-terminal device having a gate terminal 132-1, a drain terminal 132-2, and a source terminal 132-3. In the following descriptions, unless stated otherwise, designations of which terminal is a source terminal and which terminal is a drain terminal may be reversed, since source and drain terminals of FETs are typically interchangeable. The gate terminal 132-1 is coupled to a gate driver 134, the drain terminal 132-2 is coupled to what may be referred to in the following as a "drain node" 126 (with the other end of the main inductor 124 also being coupled to the drain node 126, and with the node 126 being coupled to the laser diode 110), and the source terminal 132-3 is coupled to the ground potential, as shown in FIG. 1. It should be noted that, in FIG. 1 as well as in the following figures, the ground potential is indicated as "GND," but in various embodiments, the ground potential of any of the present figures may be replaced with any other suitable potential, e.g., any suitable fixed potential, other than the ground potential. In this conventional configuration of the laser system 100, the operation of the resonant based laser driver 120 may be explained as follows.

Figure 2:
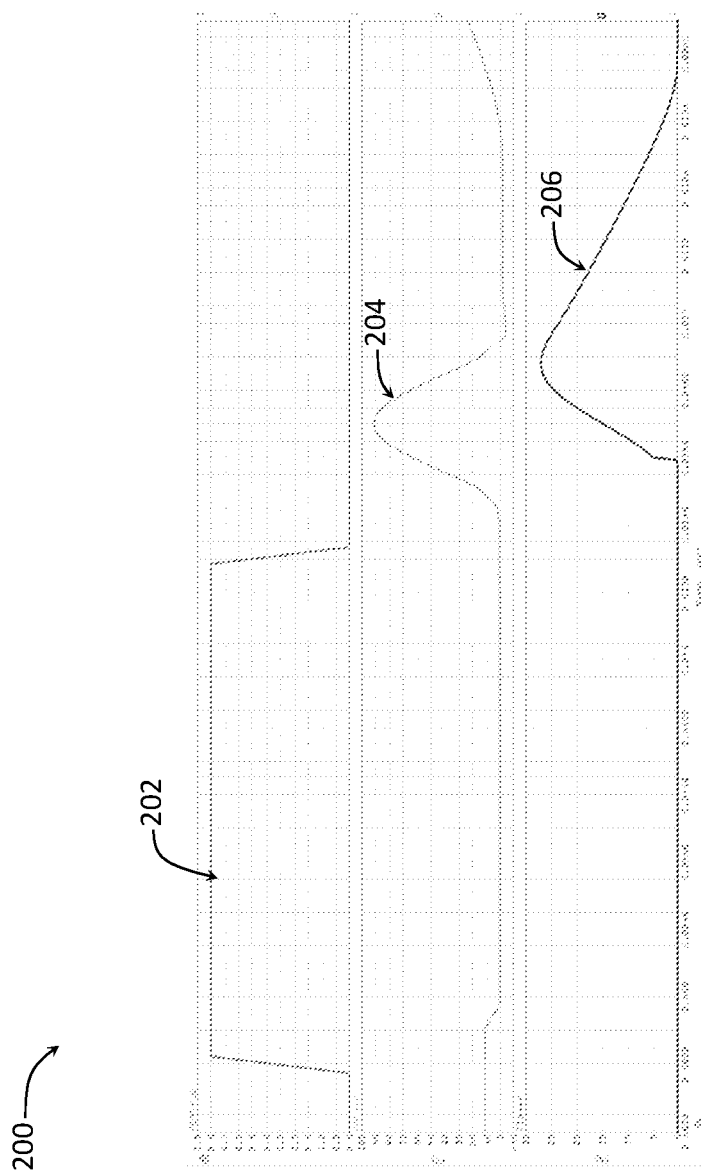
FIG. 2 is an example timing diagram for the system shown in FIG. 1.

When a certain gate voltage is applied, by the gate driver 134, to the gate terminal 132-1 of the switching transistor 130, the voltage source 122 starts to charge the main inductor 124. After the charging time, the switching transistor 130 may return to the off state (the gate driver 134 stops applying the threshold gate voltage to keep the switching transistor 130 on). At this state, the charge on the main inductor 124 increases the drain voltage of the switching transistor 130 (i.e., increases the voltage Vdrain on the drain node 126). After the drain voltage Vdrain increases and exceeds the voltage Vcathode of the voltage source 118, the laser diode 110 starts to conduct current Ilaser. The peak of this current and pulse width (i.e., duration of the current pulse) is related to the voltage Vin, the main inductor 124, the capacitance between the drain node 126 and the ground (not specifically shown in FIG. 1), the laser inductor 114, the laser capacitor 116, and the ON voltage of the laser diode 110 (i.e., the voltage at which the laser diode 110 starts to emit light). The laser diode 110 converts the current Ilaser received from the main inductor 124 to light (i.e., optical power). In this manner, a current pulse provided by the main inductor 124 results in emission of a light pulse by the laser diode 110. FIG. 2 is an example timing diagram 200 for the laser system 100 shown in FIG. 1, illustrating relative values (i.e., on the y-axis) of Vgate (shown with a curve 202), Vdrain (shown with a curve 204), and Ilaser (shown with a curve 206), as a function of time (i.e., on the x-axis), for the operation that has been described. The curve 202 illustrates a voltage applied to the switching transistor 130 to turn the transistor on so that current may be conducted between its' source and drain terminals and the main inductor 124 may be charged to a certain charge in that time. The curve 204 illustrates that once the switching transistor 130 is off, the voltage Vdrain on the drain node 126 increases and, once the Vdrain passes a certain point (namely, after Vdrain passes the on voltage of the laser diode 110), the Ilaser starts to conduct current, as shown with the curve 206. Curves 204 and 206 further show that, whenever Vdrain becomes less than Vcathode, the laser diode current Ilaser starts to decrease.

Figure 3:
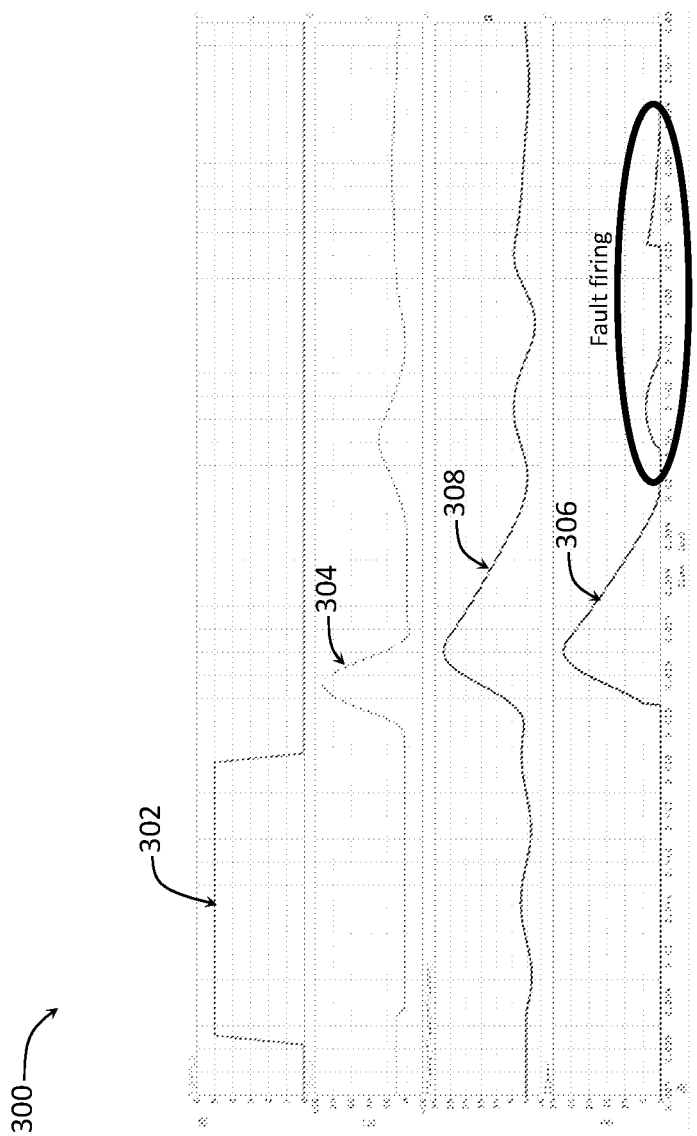
FIG. 3 is an example timing diagram illustrating desired and fault laser firing in the system shown in FIG. 1.

FIG. 3 provides an example timing diagram 300 that is similar to the diagram 200 shown in FIG. 3 but goes further in time. In particular, FIG. 3 illustrates how fault laser firing happens in the laser system 100 shown in FIG. 1. The timing diagram 300 illustrates relative values (i.e., on the y-axis) of Vgate (shown with a curve 302), Vdrain (shown with a curve 304), Ilaser 306, and a sum of Ilaser and Elmer (shown with a curve 308), as a function of time (i.e., on the x-axis). The curves 302, 304, and 306 are the same as the curves 202, 204, and 206, respectively, except that FIG. 3 illustrates each curve further in time (i.e., along the x-axis). After the laser diode current pulse (i.e., the curve 306) that was also shown in FIG. 2 reaches zero, the current changes direction, i.e., the current Ilaser becomes a negative current and now flows from the laser diode 110. A portion of the current flowing from the laser diode 110 passes through the laser capacitor 116, said portion denoted "IClaser", which can be seen by comparing the curves 306 and 308. The negative current increases the drain voltage Vdrain at the node 126. If this voltage increases to at least the on voltage of the laser diode 110, the laser diode 110 starts to conduct current and fault firing occurs, as illustrated in the curve 306 of FIG. 3, i.e., the laser diode 110 emits another pulse of light but this time it is an unintentional and undesirable pulse.

Laser Drivers with Designated Current Dissipation Paths

Figure 4:
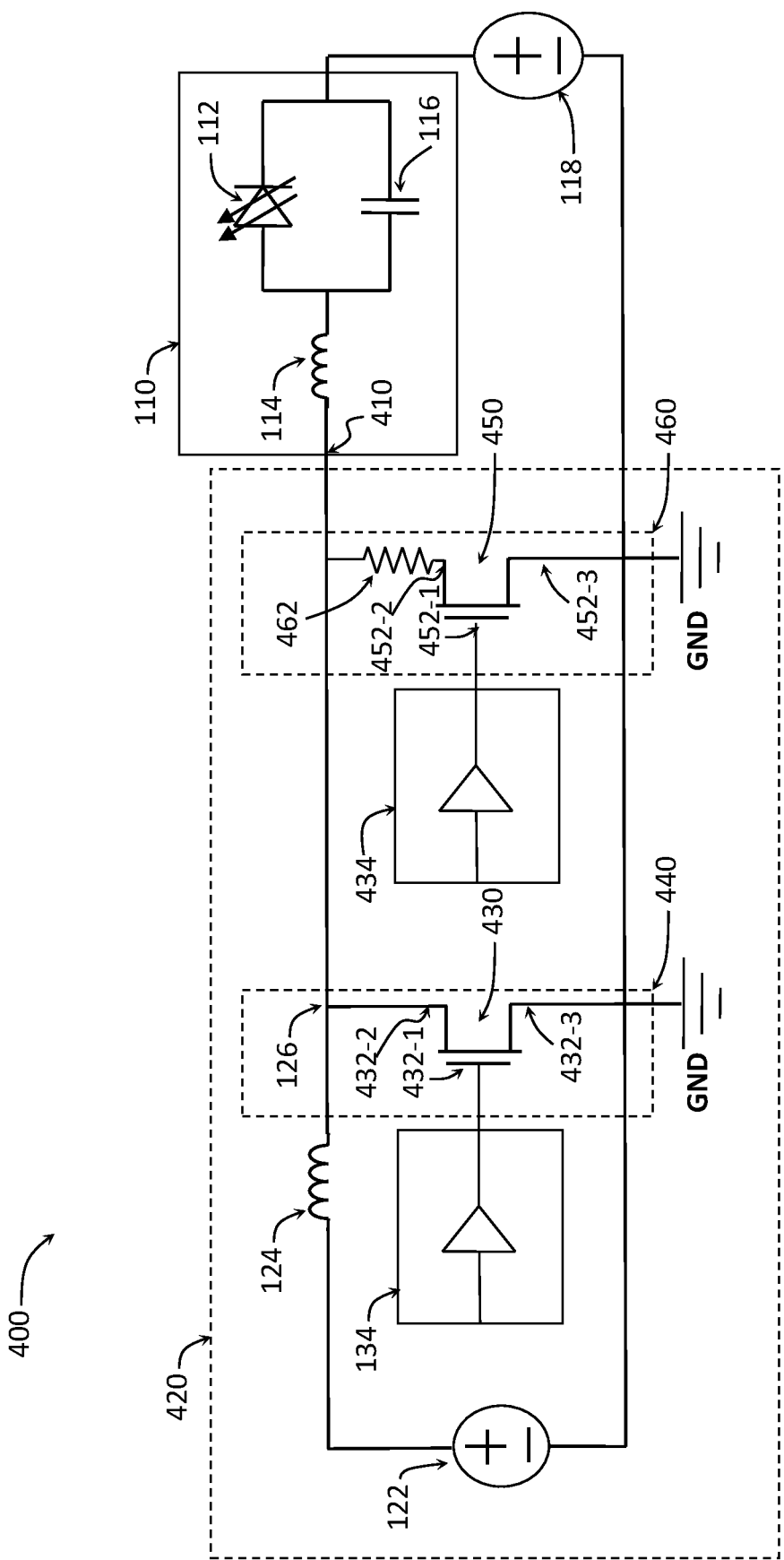
FIG. 4 is a schematic diagram of a laser system with a laser driver with a resistor in a designated current dissipation path and with two separate gate drivers, according to some embodiments of the present disclosure.
Figure 6:
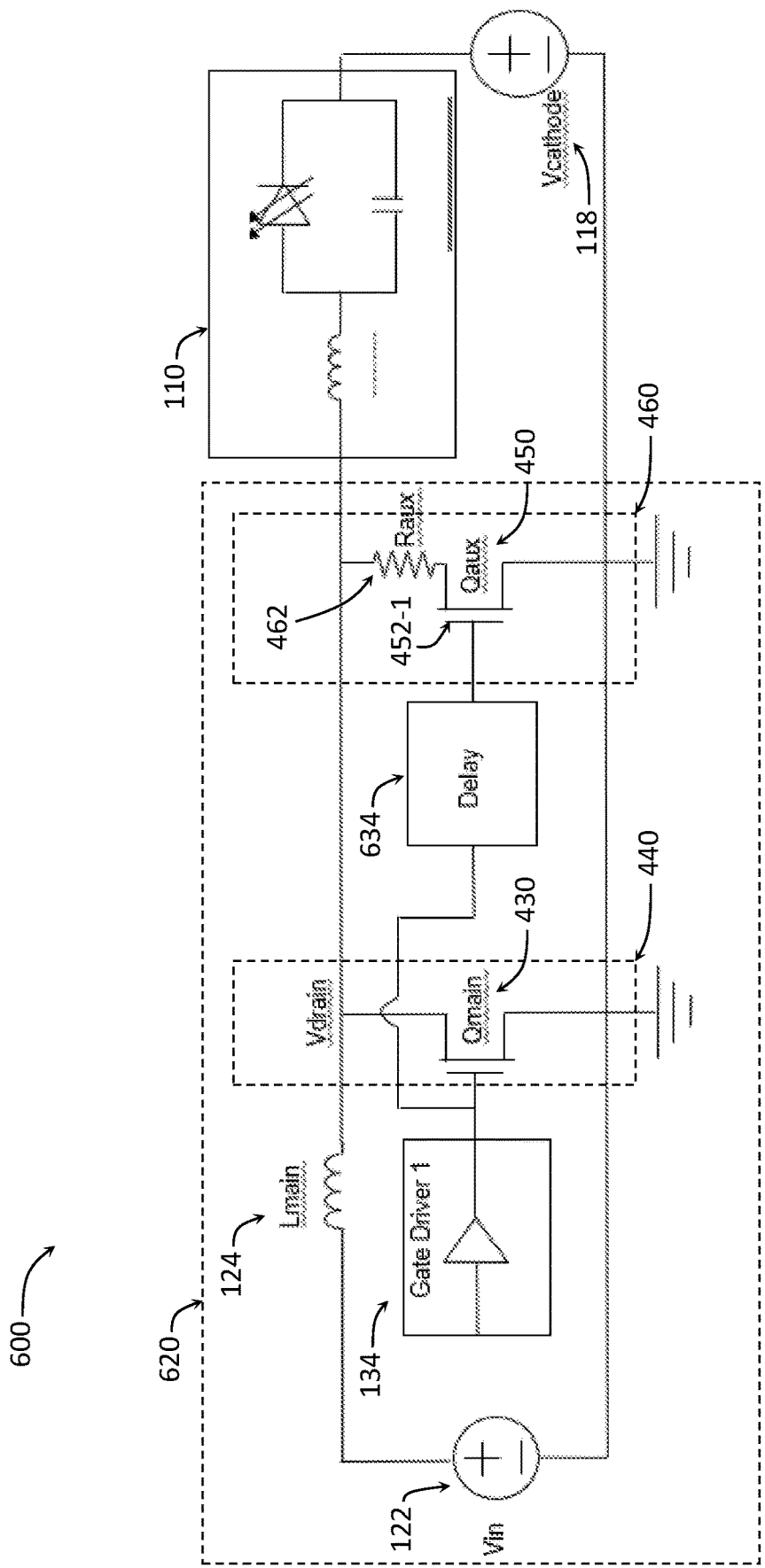
FIG. 6 is a schematic diagram of a laser system with a laser driver with a resistor in a designated current dissipation path and a single gate driver, according to some embodiments of the present disclosure.
Figure 8:
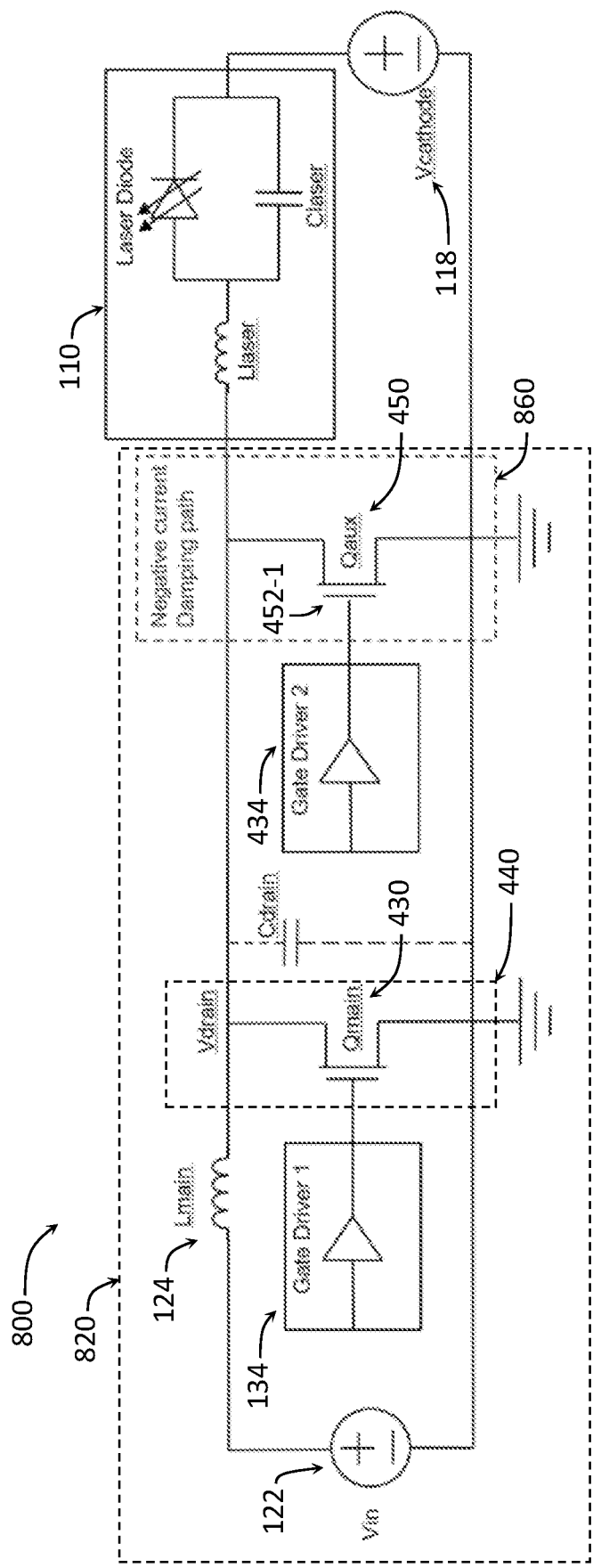
FIG. 8 is a schematic diagram of a laser system with a laser driver without a resistor in a designated current dissipation path, according to some embodiments of the present disclosure.
Figure 10:
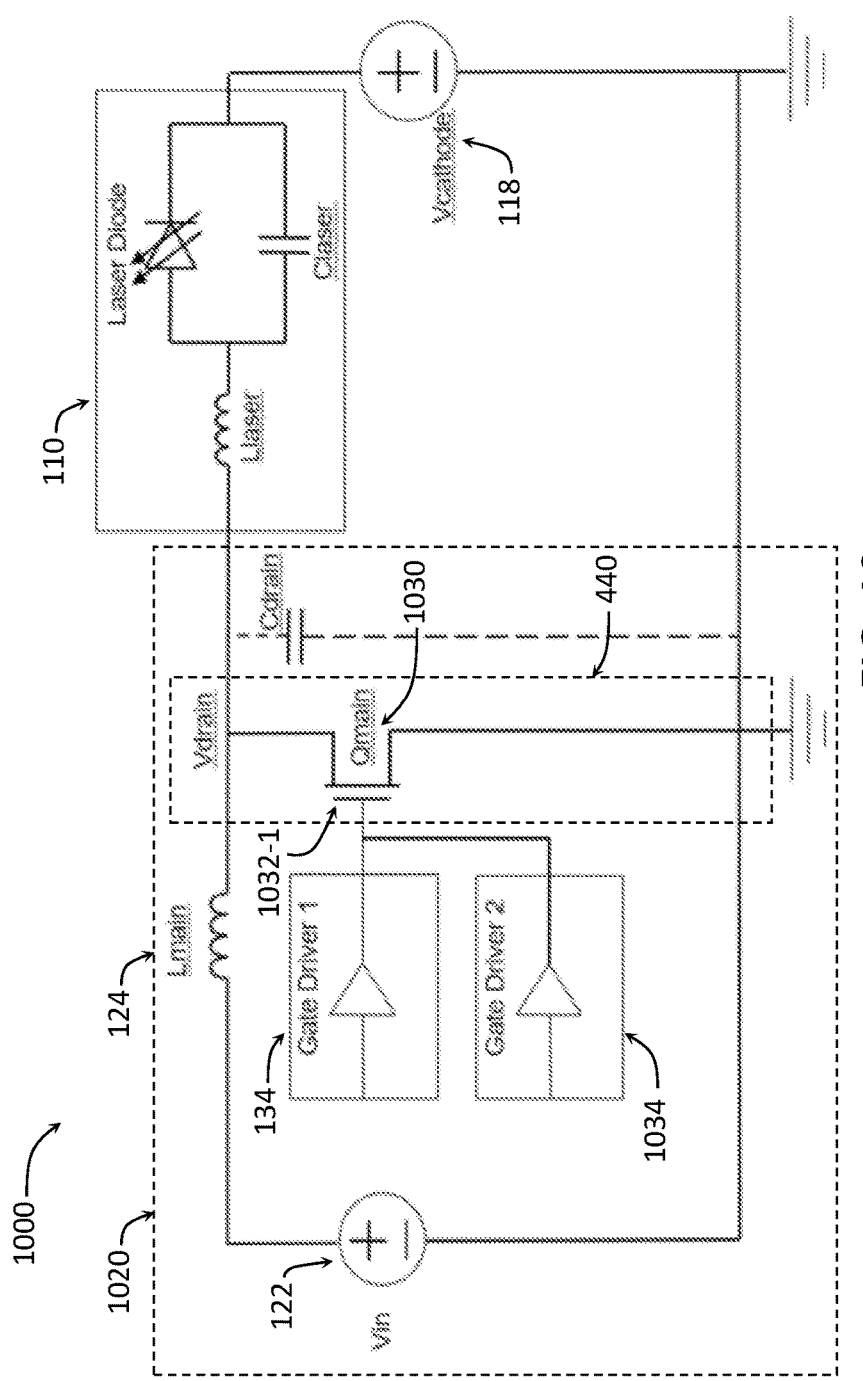
FIG. 10 is a schematic diagram of a laser system with a laser driver without a designated current dissipation path, according to some embodiments of the present disclosure.

Various aspects of the present disclosure relate to laser driver designs that aim to reduce or eliminate the above-described problem of fault laser firing. Generally, laser driver designs presented herein may be divided into two groups. The first group includes those laser driver designs that implement a current dissipation path as a designated path in a laser driver circuit, i.e., a path provided in addition to a path in which the main switch for charging the main inductor of the laser driver is provided. Example embodiments of the first group are shown in FIGS. 4, 6, and 8, and described in this sub-section of the disclosure. The second group includes those laser driver designs that do not implement a current dissipation path as a designated path in a laser driver circuit. Instead, such laser driver designs re-use the path in which the main switch for charging the main inductor of the laser driver is provided to also dissipate at least a portion of the negative current that may flow from the laser diode. One example embodiment of the second group is shown in FIG. 10, and described in the next sub-section of the disclosure.

Turning to the first example embodiment of a laser driver design of the first group, FIG. 4 is a schematic diagram of a laser system 400 with a laser driver 420 with a resistor 462 in a designated current dissipation path 460 and with two separate gate drivers 134, 434, according to some embodiments of the present disclosure. The laser driver system is similar to that shown in FIG. 1, with elements of FIG. 4 having the same reference numerals as those shown in FIG. 1 intending to illustrate similar or analogous components so that, in the interests of brevity, their descriptions are not repeated. Instead, the differences are described.

As shown in FIG. 4, the laser driver 420 includes a first path 440 and a second path 460. The first path 440 may include a first switch 430, while the second path 460 may include a second switch 450 and a resistor 462, the resistor 462 being connected in series with the switch 450. The second path 460 may be in electrical parallel with the first path 440 by virtue of having one end of each of the first and second paths 440, 460 coupled to the main inductor 124 (and also to the drain node 126 as well as to an input 410 to the laser diode 110, and having the other end of each of the first and second paths 440, 460 coupled to the ground (as shown in FIG. 4). In the following, unless stated otherwise, descriptions provided with reference to coupling to the ground potential are equally applicable to embodiments where coupling is performed to any other fixed potential, not necessarily ground potential.

In the laser system 400, the first path 440 is a path used to charge the main inductor 124, while the second path 460 is a current dissipation path configured to dissipate at least a portion of the negative current that may flow from the laser diode 110 after the laser diode 110 has emitted the desired laser pulse. The switches 430 and 450 may be used to control when the respective paths in which they are included are activated to perform their respective functions or deactivated to be idle or not to perform their respective functions. To that end, each of the switches 430 and 450 may be in a first state or in a second state, where a switch being in the first state may mean that current may be conducted through the switch (e.g., the first state may be referred to as an "on" state or the switch may be referred to as being on), while the switch being in the second state may mean that no current may be conducted through the switch (e.g., the second state may be referred to as an "off" state or the switch may be referred to as being off).

In some embodiments, each of the switches 430 and 450 may be implemented as a 3-terminal device (e.g., a transistor) having a first terminal, a second terminal, and a third terminal. Example embodiment of FIG. 4 illustrates each of the switches 430 and 450 being implemented as NMOS transistors. Therefore, these switches may also be referred to as "switching transistors." More specifically, the switching transistor 430 may be referred to as the "main transistor/switch" because it is the switch responsible for charging of the inductor 124 for the laser diode 110 to emit desired optical pulses. On the other hand, the switching transistor 450 may be referred to as an "auxiliary transistor/switch" because this switch (and the entire second path 460) is what can be added on top of a conventional laser driver implementation such as the one that was shown in FIG. 1. As shown in FIG. 4, the main transistor 430 may be a 3-terminal device having a gate terminal 432-1, a drain terminal 432-2, and a source terminal 432-3 (again, in other embodiments, the source and drain terminals may be interchanged, i.e., the terminal 432-2 may be a source terminal and the terminal 432-3 may be a drain terminal). Similar to the switching transistor 130 shown in FIG. 1, the gate terminal 432-1 of the main transistor 430 may be coupled to the gate driver 134, the drain terminal 432-2 may be coupled to the drain node 126, to the main inductor 124, and to the input 410 of the laser diode, and the source terminal 432-3 may be coupled to the ground or other fixed potential, as shown in FIG. 4. Similarly, the auxiliary transistor 450 may be a 3-terminal device having a gate terminal 452-1, a drain terminal 452-2, and a source terminal 452-3 (again, in other embodiments, the source and drain terminals may be interchanged, i.e., the terminal 432-2 may be a source terminal and the terminal 432-3 may be a drain terminal). As shown in FIG. 4, the gate terminal 452-1 of the auxiliary transistor 450 may be coupled to a gate driver 434, the drain terminal 452-2 may be coupled to the drain node 126, to the main inductor 124, and to the input 410 of the laser diode, but, in contrast to the main transistor 430, this time the coupling is via the resistor 462, and the source terminal 452-3 may be coupled to the ground or other fixed potential.

The gate drivers 134, 434 may be used to provide gate voltages to turn their respective transistors 430, 450 on and off, or, phrased differently, to place the switches 430, 450 into the first or the second state. For example, the main transistor 430 may be in the first state when a first voltage is applied to the gate terminal 432-1, the first voltage being sufficient to enable conduction of current between source and drain terminals of the main transistor 430. The main transistor 430 may be in the second state when a different, second voltage (which may include a zero voltage), is applied to the gate terminal 432-1 and no current is conducted between source and drain terminals of the main transistor 430. The auxiliary transistor 450 may operate similarly, where, in some embodiments, the voltages to be applied to the gate terminal to place the main transistor 430 and the auxiliary transistor 450 into the first/second state may be the same, while, in other embodiments, voltages for these two transistors may be different.

Figure 5:
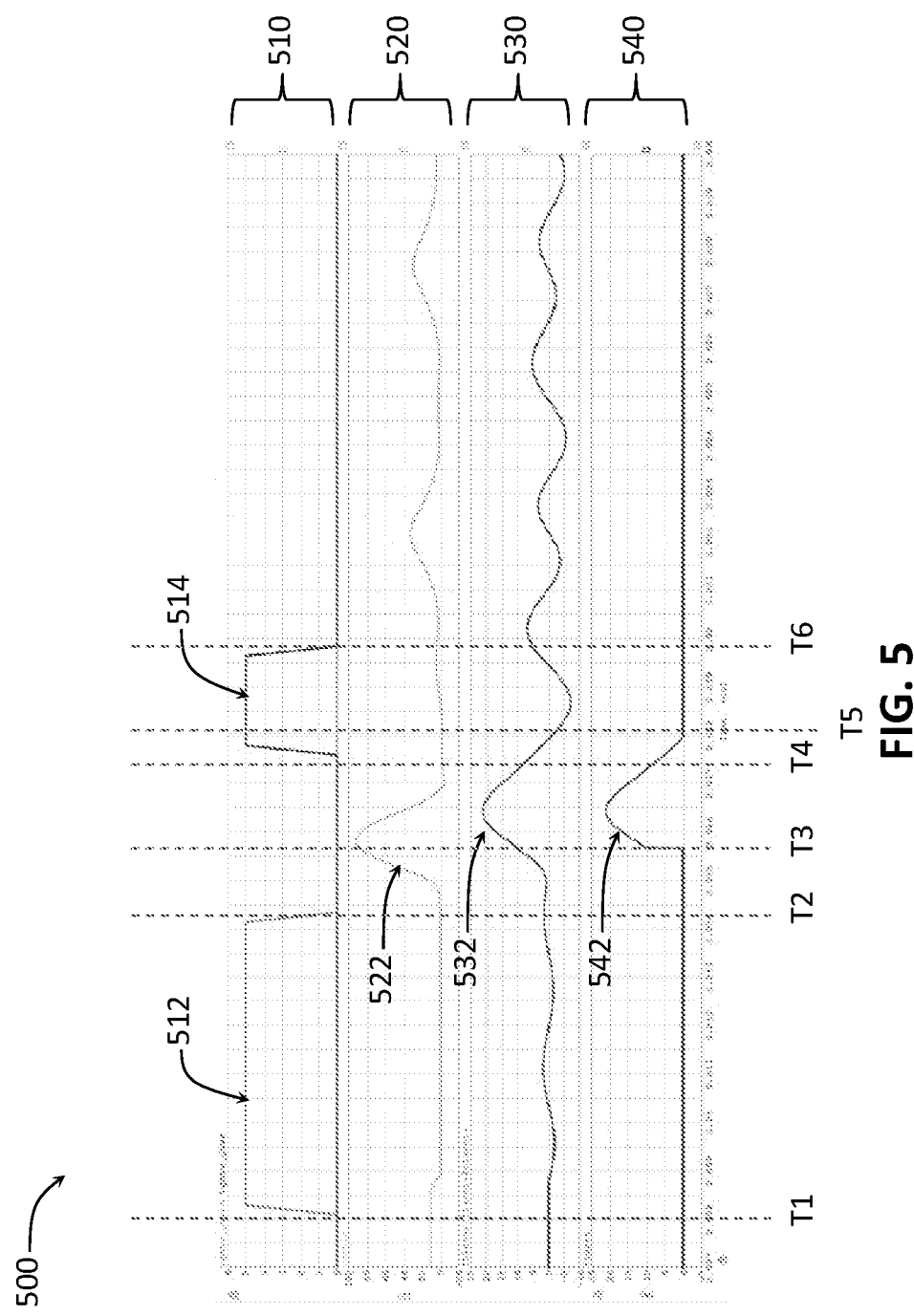
FIG. 5 is an example timing diagram for the system shown in FIG. 4, according to some embodiments of the present disclosure.

The timing of various operations of the laser system 400 may be described with reference to a timing diagram shown in FIG. 5. The timing diagram 500 illustrates sections 510, 520, 530, and 540, each of which showing relative values (on the vertical axis of FIG. 5) of a given parameter as a function of time (on the horizontal axis of FIG. 5) for the operation of the laser system 400. In particular, section 510 illustrates relative values of gate voltages applied to the gates of the transistors 430 and 450 (or, more generally, illustrates whether a given path 440, 460 is activated or not), section 520 illustrates relative values of the voltages on the drain node 126 (Vdrain), section 530 illustrates relative values of a sum of Ilaser and IClaser, and section 530 illustrates relative values of Ilaser.

Operation of the laser system 400 may begin with placing the main switch 430 into an on state (e.g., by applying, to the gate 432-1 of the main transistor 430, a sufficient gate voltage above the threshold voltage), thus activating the first path 440, while the auxiliary switch 450 is in an off state (e.g., by applying, to the gate 452-1 of the auxiliary transistor 450, no voltage or only a small voltage below the threshold voltage of that transistor) and the second path 460 is deactivated. This is illustrated in the section 510 of FIG. 5 with a signal 512 being representative of a gate voltage applied to the gate 432-1 of the main transistor 430 at time T1. The main switch 430 may be kept in an on state for the duration of time sufficient to charge the main inductor 124. This is illustrated in the section 510 of FIG. 5 with the signal 512 being maintained from the time T1 until the time T2, which is when the main switch 430 is placed into an off state and the first path 440 is deactivated. At this point, the charge on the main inductor 124 starts to increases the voltage Vdrain on the drain node 126, as is shown with a rise in a curve 522 shown in section 520 of FIG. 5. After the drain voltage Vdrain increases and exceeds the voltage Vcathode of the voltage source 118, the laser diode 110 starts to conduct current Ilaser, at time T3, as is shown with a rise in a curve 542 shown in section 540 of FIG. 5. Correspondingly, there is a rise in a curve 532 shown in section 530 of FIG. 5. The laser diode 110 conducts current pulse Ilaser (current pulse 542) between times T3 and T5, labeled in FIG. 5. The peak of the current and pulse width (i.e., duration of the current pulse 542 shown in the section 540) may be related to the voltage Vin, the main inductor 124, the capacitance between the drain node 126 and the ground (not specifically shown in FIG. 5), the laser inductor 114, the laser capacitor 116, and the ON voltage of the laser diode 110 (i.e., the voltage at which the laser diode 110 starts to emit light). The laser diode 110 converts the current pulse 542 received from the main inductor 124 to light (i.e., optical power). In this manner, a current pulse provided by the main inductor 124 results in emission of a light pulse by the laser diode 110.

The auxiliary switch 450 remains off for the entire duration of time from T1 to almost the end of the current pulse 542. More specifically, the auxiliary switch 450 may be configured to be turned on at time T4, at which point most of the current pulse 542, e.g., 90% of the current or about 90% of the duration of the current pulse 542 has been provided to the laser diode 110. Thus, the auxiliary switch 450 may remain off for the entire duration of time from T1 to T4. In some embodiments, the auxiliary switch 450 may be placed in an on state at time T5, i.e., substantially at the end of the current pulse 542. The auxiliary switch 450 is placed into an on state (e.g., by applying, to the gate 452-1 of the auxiliary transistor 450, a sufficient gate voltage above the threshold voltage), thus activating the second path 460, while the main switch 430 remains in an off state (e.g., by applying, to the gate 432-1 of the main transistor 430, no voltage or only a small voltage below the threshold voltage of that transistor) and the first path 450 is deactivated. This is illustrated in the section 510 of FIG. 5 with a signal 514 being representative of a gate voltage applied to the gate 452-1 of the auxiliary transistor 450 at time T4. The auxiliary switch 450 is placed in an on state around the time when the negative current may start flowing from the laser diode 110 back to the laser driver 420, as is shown with the ripples in the curve 532 shown in the section 530 of FIG. 5 after the time T4. Placing the auxiliary switch 450 into an on state provides a path for the negative current from the laser diode 110 to be dissipated by the resistor 462, so that the negative current does not charge the main inductor 124, thereby preventing fault laser firing by the laser diode 110. To that end, the auxiliary switch 450 may be kept in an on state for the duration of time sufficient to dissipate at least a portion, or all of, the negative current that may be flowing from the laser diode 110, so that the current does not substantially charge the main inductor 124. This is illustrated in the section 510 of FIG. 5 with the signal 514 being maintained from the time T4 until the time T6, which is when the auxiliary switch 450 is placed into an off state and the second path 460 is deactivated.

The timing of various operations of the laser system 400, in particular the timing of when the main and the current dissipation paths are activated and deactivated, e.g., as described with reference to FIG. 5, may be controlled using control logic. An example implementation of such control logic is described with reference to the controller 1560 shown in FIG. 15. In some embodiments, the controller 1560 may be pre-programmed with the times when to turn on and off the various paths/switches, e.g., with respect to a certain starting point such as with respect to the start of charging of the main inductor 124. In other embodiments, one or more sensors may be used to sense the state of various portions of the laser system 400 and provide information to the controller 1560 so that the controller 1560 can use this information to turn on and off the various paths/switches.

As the foregoing illustrates, the path 460 may be seen as a current dissipation path for dissipating at least a portion of the negative current that may be originating from the laser diode 110. For the duration of time when the main switch 430 is in the on state and for the duration of time following that and up until about 90% of the current pulse has been provided from the main inductor 124 to the laser diode 110 the auxiliary switch 450 is in the off state and the current dissipation path 460 does not provide any noticeable resistance to the circuit 400. The current dissipation path 460 is configured to start providing a resistance for dissipating at least a portion (but preferably substantially all) of the current from the laser diode 110 when the auxiliary switch 450 is placed in the on state, which may be after at least 90% of the current pulse has been provided to the laser diode. In some embodiments, the auxiliary switch 450 may be placed in the on state before about 110% of the duration of the current pulse has elapsed, e.g., before about 105% of the duration of the current pulse has elapsed, e.g., right after the current pulse ended (i.e., when 100% of the duration of the current pulse has elapsed), to make sure that the current dissipation path 460 is activated in time to dissipate the negative current from the laser diode 110. In some embodiments, the latest point in time when the auxiliary switch 450 is placed in the on state for the path 460 to start dissipating negative current should be before the Vdrain increases so much that the laser could be ON and conduct fault firing current. Providing the current dissipation path, i.e., the path 460, with its own switch, i.e., the auxiliary switch 450, in electrical parallel to the path that contains the main switch (i.e., the path 430 with the main switch 430) that controls charging of the inductor provides a convenient manner to control when the current dissipation path is turned on (by virtue of the auxiliary switch 450 being placed in the first/on state) to dissipate the current from the laser driver 110. When such current dissipation is not needed, e.g., when the main inductor 124 is being charged and when the majority of the current pulse is being provided from the main inductor 124 to the laser driver 110, the current dissipation path is turned off by virtue of the auxiliary switch 450 being in the second/off state.

Deliberately including a resistor, i.e., the resistor 462, in the current dissipation path 460 (i.e., including a resistor with a certain desired resistance), as opposed to counting on a resistance which may otherwise be inherent to the circuit elements and interconnects of the current dissipation path 460, advantageously allows controlling the amount of the resistance for dissipating the current from the laser diode 110 when the auxiliary switch 450 is in the on state. In some embodiments, such the resistor 462 may be a variable resistor. In some embodiments, the resistance provided by the current dissipation path 460, e.g. the resistance of the resistor 462 may be at least 2 times higher, e.g., at least 4 times higher or at least 8 times higher, than a resistance of the path 440 that includes the main switch 430. In this manner, the resistance of the current dissipation path may be high enough to be able to dissipate sufficient amount of the current from the laser diode 110 while the resistance of the path that includes the main switch 430 may be low enough to not hinder charging of the main inductor 124.

FIG. 6 is a schematic diagram of a laser system 600, illustrating the second example embodiment of a laser driver design of the first group (i.e., laser driver designs that implement a current dissipation path as a designated path in a laser driver circuit), according to some embodiments of the present disclosure. The laser system 600 is similar to that shown in FIG. 4, where elements of FIG. 6 having the same reference numerals as those shown in FIG. 4 intend to illustrate similar or analogous components so that, in the interests of brevity, their descriptions are not repeated. Instead, the differences of FIG. 6 with respect to FIG. 4 are described.

As shown in FIG. 6, the laser system 600 includes a laser driver 620. Similar to the laser driver 420, the laser driver 620 is coupled to the laser diode 110, and includes most of the elements shown in FIG. 4, except that, in order to not clutter the drawings, FIG. 6 does not explicitly provide reference numerals for the individual elements of the laser driver 110 and for most of the individual terminals of the main and auxiliary switches 430, 450. In contrast to FIG. 4, the laser driver 620 of FIG. 6 does not include a designated gate driver for the auxiliary switch 450 (i.e., FIG. 6 does not include the gate driver 434 shown in FIG. 4). Instead, the laser driver 620 includes a delay element 634, as shown in FIG. 6. The output of the gate driver 134 for the main switch 430 is coupled not only to the gate terminal of the main switch 430 but also to the delay element 634 (e.g., to the input of the delay element 634). The output of the delay element 634 is, in turn, coupled to gate terminal 452-1 of the auxiliary switch 450. In this manner, the delay element 634 is configured to delay the voltage pulse provided by the gate driver 134 for the main switch 430 by a certain time so that substantially the same voltage pulse may later be applied to the auxiliary switch 450. Thus, in the embodiment of FIG. 6, the gate voltages that may be applied to the auxiliary transistor 450 are substantially the same as the gate voltages that the gate driver 134 applies to the main transistor 430, except that they are delayed in time. In this manner, the need for the gate driver 434 may be eliminated and only a single gate driver may be used. Using a single driver for the first and second switches may be advantageous in terms of reducing the cost and the die area required to implement the laser driver, as well as reducing power consumption of a laser driver.

Figure 7:
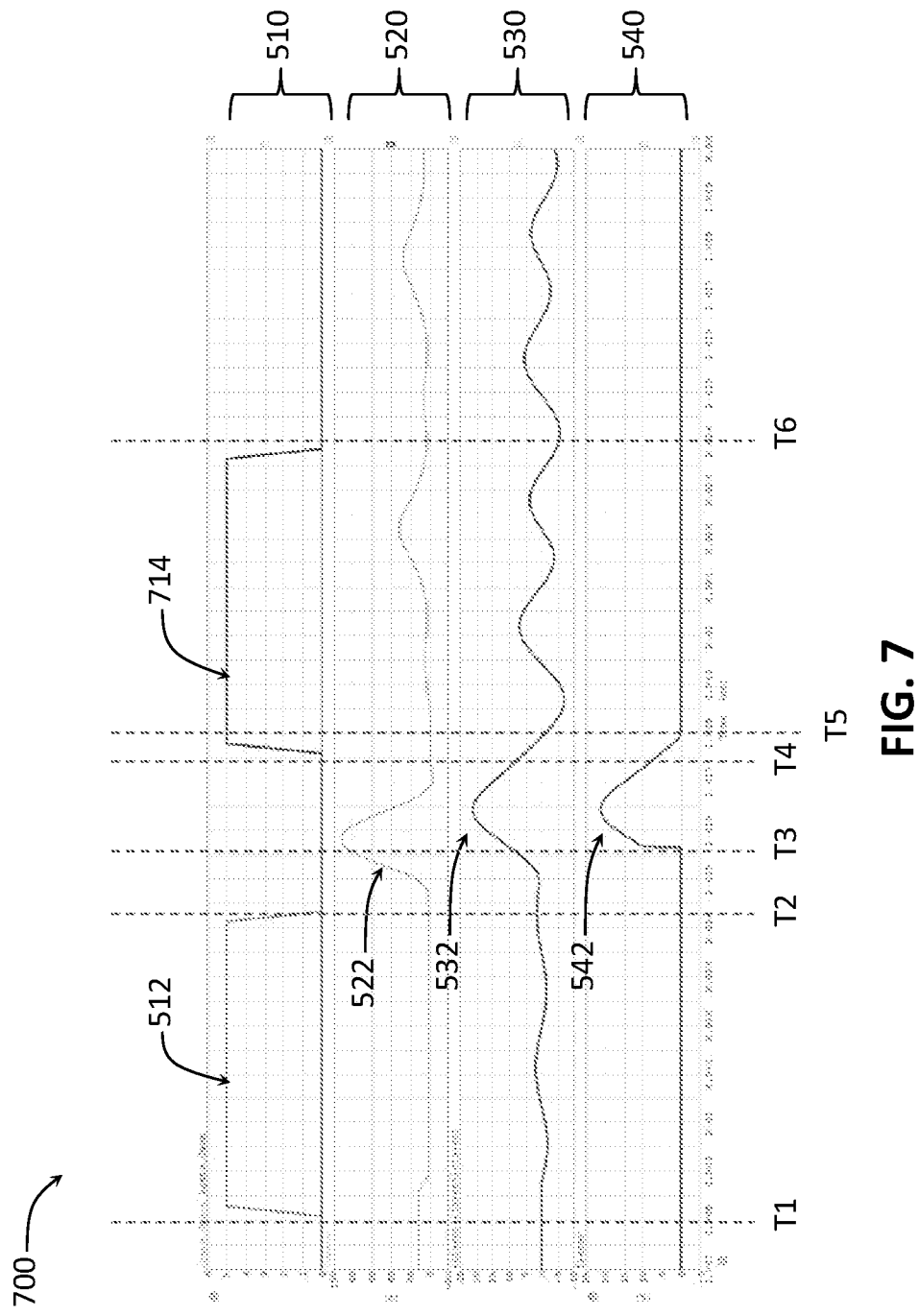
FIG. 7 is an example timing diagram for the system shown in FIG. 6, according to some embodiments of the present disclosure.

The timing of various operations of the laser system 600 may be described with reference to a timing diagram shown in FIG. 7. The timing diagram 700 illustrates sections 510, 520, 530, and 540, analogous to the sections of FIG. 5. Again elements of the timing diagram 700 which are labeled with the same reference numerals as those shown in the timing diagram 500 are assumed to be analogous and their description, therefore, is not repeated here, and only differences are described.

Operation of the laser system 600 is similar to the operation of the laser system 400, described above, where the times T1-T6 refer to the same times as those described with reference to FIG. 5. What is different in FIG. 7 is that the signal 514 shown in FIG. 5 is replaced with a signal 714. Similar to the signal 514, the signal 714 is representative of a gate voltage applied to the gate 452-1 of the auxiliary transistor 450 of the laser driver 620 at time T4. However, because the gate voltage applied to the gate 452-1 is a delayed version of the gate voltage applied to the gate 432-1 of the main transistor 430, the signal 714 is shown to have substantially the same duration and amplitude (or, more generally, form) as the signal 514, just delayed in its starting time by the difference between the times T4 and T1. The delay by which the application of the signal 714 is delayed with respect to the signal 514 may be selected based on the same considerations provided above for the time T4 when the signal 514 may start. What's different in FIG. 7, is that the difference between the times T6 and T4, i.e., the duration of the signal 714, may be different from the difference between times T6 and T4 shown in FIG. 5, i.e., the duration of the signal 514. Of course, when a designated gate driver 434 is used as described with reference to FIG. 4, the duration of the signal 514 may be longer than what is shown in FIG. 5 and may, in some embodiments, be the same or longer than the duration of the signal 714 shown in FIG. 7. Similarly, when a designated gate driver 434 is used as described with reference to FIG. 4, the amplitude of the signal 514 may be the same as the amplitude of the signal 714 shown in FIG. 7 in some embodiments, while, in other embodiments, these amplitudes may be different. Furthermore, the amplitudes of the signals 514 and 714 are described above and shown to be substantially the same in FIG. 7 for the simple case where the delay element 634 merely provides time delay to the signal 514. However, in other embodiments of the laser driver 620, the delay element 634 may further be configured to change the amplitude of the signal 514 (e.g., to attenuate it, or to gain it), as may be desirable for a particular design of the laser driver 620. The timing of various operations of the laser system 600, as well as whether or not the delay element 634 is to change the amplitude of the voltage pulse 514 to provide the voltage pulse 714, may be controlled using the controller 1560.

FIG. 8 is a schematic diagram of a laser system 800, illustrating the third example embodiment of a laser driver design of the first group (i.e., laser driver designs that implement a current dissipation path as a designated path in a laser driver circuit), according to some embodiments of the present disclosure. The laser system 800 is similar to that shown in FIG. 4, where elements of FIG. 8 having the same reference numerals as those shown in FIG. 4 intend to illustrate similar or analogous components so that, in the interests of brevity, their descriptions are not repeated. Instead, the differences of FIG. 8 with respect to FIG. 4 are described.

As shown in FIG. 8, the laser system 800 includes a laser driver 820. Similar to the laser driver 420, the laser driver 820 is coupled to the laser diode 110, and includes most of the elements shown in FIG. 4, except that, in order to not clutter the drawings, FIG. 8 does not explicitly provide reference numerals for the individual elements of the laser driver 110 and for most of the individual terminals of the main and auxiliary switches 430, 450. In FIG. 8, the current dissipation path 460 of FIG. 4 is labeled as a current dissipation path 860 because it is different from the current dissipation path 460. Namely, as shown in FIG. 8, the current dissipation path 860 does not include a designated resistor in series with the switch 450 (i.e., it does not include the resistor 462, described with reference to FIG. 4). Instead, the resistance of the current dissipation path 860 may be controlled by the absolute value of the amplitude of the voltage applied to the gate terminal 452-1 of the auxiliary transistor 450. In some embodiments, the smaller is the absolute value of the amplitude of the voltage applied to the gate terminal 452-1 when the current dissipation path 860 is supposed to be activated to dissipate the negative current from the laser diode 110, the larger is the resistance of the current dissipation path 860 (provided the absolute value of the amplitude of the voltage applied to the gate terminal 452-1 between the times T4 and T6, described above, is still suitable to turn on/activate the current dissipation path 860 to dissipate the negative current from the laser diode 110).

Figure 9:
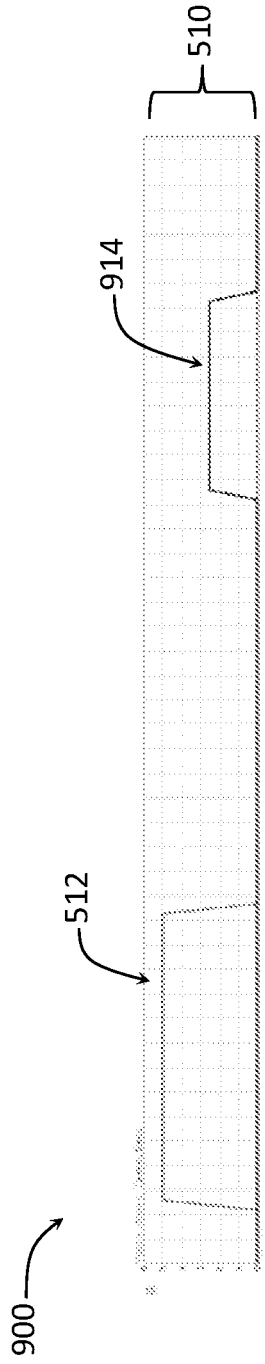
FIG. 9 is an example timing diagram for the system shown in FIG. 8, according to some embodiments of the present disclosure.

The timing of the gate operations of the laser system 800 may be described with reference to a timing diagram shown in FIG. 9. The timing diagram 900 illustrates the section 510, similar to that shown in FIG. 5 (sections 520, 530, and 540 are not shown in the interests of brevity). The timing diagram 900 illustrates the signal 512, which may be analogous to that described with reference to FIG. 5. What is different in FIG. 9 is that the signal 514 shown in FIG. 5 is replaced with a signal 914. Similar to the signal 514, the signal 914 is representative of a gate voltage applied to the gate 452-1 of the auxiliary transistor 450 of the laser driver 820 at time T4. However, because in the laser driver 820 the gate voltage applied to the gate 452-1 is used to achieve a desired resistance of the current dissipation path 860, the amplitude of the signal 914 is likely to be smaller than the amplitude of the signal 514 to ensure that the resistance of the current dissipation path 860 is high enough to be able to dissipate sufficient amount of the current from the laser diode 110 while the resistance of the path 440 that includes the main switch 430 is low enough to not hinder charging of the main inductor 124. In some embodiments, the amplitude of the signal 914 may be such that the resistance provided by the current dissipation path 860 when the current dissipation path 860 is supposed to be on may be at least 2 times higher, e.g., at least 4 times higher or at least 8 times higher, than a resistance of the path 440 that includes the main switch 430.

To summarize the embodiment shown in FIG. 8, the value of the voltage applied to the gate terminal 452-1 affects the resistance between the source and drain terminals of the auxiliary switch 450. Therefore, in the laser system 800, the value of the voltage applied to the gate terminal 452-1 may be modified to control the value of the resistance for dissipating the current from the laser diode 110 by the current dissipation path 860. In particular, making the value of the voltage 914 applied to the gate terminal 452-1 smaller than the value of the voltage 714 may ensure that the resistance of the current dissipation path 860 when the auxiliary switch 450 is in the first state is higher compared to the resistance of the main path 440 when the main switch 430 is in the first state.

Employing designated gate drivers 134 and 434 to be able to select the gate voltage for the gate terminal 452-1 to control the resistance of the current dissipation path 860 in absence of using a designated resistor for that may be particularly useful, which is why the laser driver 820 illustrates such an arrangement where two individual gate drivers are shown. However, in other embodiments of the laser driver 820, instead of using the gate driver 434, a single gate driver 134 and a delay element 634 may be used as described with reference to FIG. 6, as long as the delay element 634 is also configured to attenuate the signal 514 to make it sufficiently small to increase the resistance of the current dissipation path 860, provided all else is substantially equal for the paths 440 and 860.

In some embodiments of the laser drivers according to any one of the laser driver designs of the first group, each of the main switch 430 and the auxiliary switch 450 may be implemented as a FET (e.g., a MOSFET), as shown in FIGS. 4, 6, and 8. In various such embodiments, each of the main switch 430 and the auxiliary switch 450 may be implemented either as an enhancement-mode FET (i.e., a transistor that is designed to be "off" at zero gate-source voltage) or a depletion-mode FET (i.e., a transistor that is designed to be "on" at zero gate-source voltage). In other embodiments of the laser drivers according to any one of the laser driver designs of the first group, each of the main switch 430 and the auxiliary switch 450 may be implemented as a bipolar transistor, e.g., as an NPN transistor. In such embodiments, descriptions provided with respect to the gate terminal of the switches 430, 450 would be applicable to a base terminal of the NPN transistors implementing these switches, descriptions provided with respect to the drain terminal of the switches 430, 450 would be applicable to a collector terminal of the NPN transistors implementing these switches, and descriptions provided with respect to the source terminal of the switches 430, 450 would be applicable to an emitter terminal of the NPN transistors implementing these switches. In general, in various embodiments, each of the main switch 430 and the auxiliary switch 450 may be implemented either as an N-type transistor (e.g., an NMOS transistor if the switch is implemented as a FET, or an NPN transistor if the switch is implemented as a bipolar transistor), or as a P-type transistor (e.g., a PMOS transistor if the switch is implemented as a FET, or a PNP transistor if the switch is implemented as a bipolar transistor). In some embodiments, at least one of the main switch 430 and the auxiliary switch 450 may be implemented as a III-N transistor, e.g., as a GaN transistor. In still other embodiments of the laser driver according to any one of the laser driver designs of the first group, each of the main switch 430 and the auxiliary switch 450 may be implemented as a p-i-n diode.

Laser Drivers with Designated Current Dissipation Paths

Now turning to a first example embodiment of a laser driver design of the second group, FIG. 10 is a schematic diagram of a laser system 1000 with a laser driver 1020 without a designated current dissipation path, according to some embodiments of the present disclosure. The laser system 1000 is similar to that shown in FIG. 8, where elements of FIG. 10 having the same reference numerals as those shown in FIG. 8 intend to illustrate similar or analogous components so that, in the interests of brevity, their descriptions are not repeated. Instead, the differences of FIG. 10 with respect to FIG. 8 are described.

As shown in FIG. 10, the laser system 1000 includes a laser driver 1020. Similar to the laser driver 820, the laser driver 1020 is coupled to the laser diode 110, and includes some of the elements shown in FIG. 8, except that, in order to not clutter the drawings, FIG. 10 does not explicitly provide reference numerals for the individual elements of the laser driver 110. FIG. 10 illustrates a main switch 1030, which is similar to the main switch 430, except that is may be in one of three states, as described in greater detail below. In contrast to FIG. 8, the laser driver 1020 of FIG. 10 does not include a designated current dissipation path and, hence, does not include an auxiliary switch (i.e., FIG. 10 does not include the current dissipation path 860 and the auxiliary switch 450 shown in FIG. 8). Instead, the laser driver 1020 includes a second gate driver 1034, coupled to the switch 1030 in addition to the gate driver 134, as described above, being coupled to the main switch 1030. The gate drivers 134 and 1034 are configured to manipulate the resistance for dissipating current, similar to FIG. 8 except that it is the resistance of a single path, namely, the path 440, that is manipulated to either be low enough to charge the main inductor 124 in the time period between the times T1 and T2, as described above, or to dissipate the negative current from the laser diode 110 in the time period between the times T4 and T6, also described above.

Thus, the main switch 1030 included in the laser driver 1020 may be configured to be in one of three states. The switch 1030 may be configured to be in the first state to charge the main inductor 124, similar to the switch 430 being in the on state to charge the main inductor 124, as described above. The switch 1030 may further be configured to be in the second state to provide current from the main inductor 124 to the laser diode 110 to cause the laser diode to emit an optical pulse, similar to the functionality of the switch 430 being in the off state to enable provision of current indicative of the charge on the main inductor 124 to the laser diode 110. In contrast to the switch 430, the switch 1030 may also be configured to be in the third state to provide a sufficient resistance in the path 440 for dissipating at least a portion (but preferably substantially all of) the negative current from the laser diode 110. In this manner, having to include an additional switch (e.g., the auxiliary switch described above) in an additional, designated current dissipation path may, advantageously, be avoided. Instead, in the laser system 1000, the current dissipation may be achieved by ensuring that the resistance between the source and drain terminals of the switch 1030 is high enough to effectively dissipate the current from the laser diode 110 at some times (when the switch 1030 is in the third state), while the resistance is low enough to effectively charge the main inductor 124 at other times (when the switch 1030 is in the first state).

The switch 1030 may be put in the first state by the gate driver 134 applying a suitable voltage to the gate terminal 1032-1 to enable current to flow between the source and drain terminals of the switch 1030 and the resistance of the path 440 being sufficiently low to not hinder charging of the main inductor 124. The switch 1030 may be in the first state between times T1 and T2, described above, and the descriptions provided above with respect to charging the main inductor 124 are applicable to the switch 1030 in its' first state.

The switch 1030 may be put in the second state by the gate driver 134 or the gate driver 1034 applying a suitable voltage (including applying a zero voltage) to the gate terminal 1032-1 to ensure that no current flows between the source and drain terminals of the switch 1030 and the path 440 is deactivated. The switch 1030 may be in the second state between times T2 and T4, described above, and the descriptions provided above with respect to discharging the main inductor 124 and the current pulse provided to the laser diode 110 at time T3 to cause emission of a laser pulse are applicable to the switch 1030 in its' second state.

The switch 1030 may be put in the third state by the gate driver 1034 applying a suitable voltage to the gate terminal 1032-1 to enable current to flow between the source and drain terminals of the switch 1030 and the resistance of the path 440 being sufficiently high to enable dissipation of the negative current from the laser diode 110 by the path 440. The switch 1030 may be in the third state between times T4 and T6, described above, and the descriptions provided above with respect to dissipating the negative current are applicable to the switch 1030 in its' third state. In some embodiments, the resistance of the path 440 when the switch 1030 is in the third state may be at least 2 times higher, e.g., at least 4 times higher or at least 8 times higher, than the resistance of the path 440 when the switch 1030 is in the first state, but lower than the resistance of the path 440 when the switch 1030 is in the second state.

In some embodiments, the gate voltage applied to the switch 1030 by the gate driver 1034 may be lower than the gate voltage applied to the switch 1030 by the gate driver 134, to ensure that the resistance of the path when the switch 1030 is in the third state is higher than the resistance of the path when the switch 1030. The absolute value of the amplitude of the voltage applied to the gate terminal 1032-1 by the gate driver 1034 should such as to turn on/activate the current dissipation path 440 to dissipate the negative current from the laser diode 110 between the times T4 and T6. For example, in some embodiments, an absolute value of the gate voltage applied by the gate driver 1034 may be smaller than an absolute value of the gate voltage applied by the gate driver 134 while being equal to or larger than a threshold voltage (i.e., the turn-on voltage) of the switch 1030.

Figure 11:
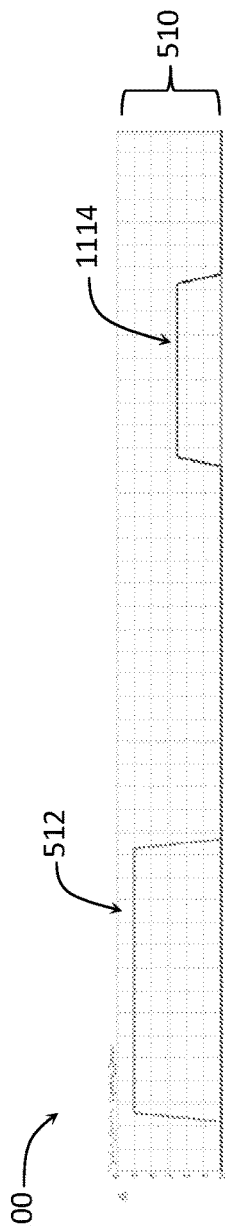
FIG. 11 is an example timing diagram for the system shown in FIG. 10, according to some embodiments of the present disclosure.

The timing of the gate operations of the laser system 1000 may be described with reference to a timing diagram shown in FIG. 11. The timing diagram 1100 illustrates the section 510, similar to that shown in FIG. 5 (sections 520, 530, and 540 are not shown in the interests of brevity). The timing diagram 1100 illustrates the signal 512, which may be analogous to that described with reference to FIG. 5. What is different in FIG. 11 is that the signal 514 shown in FIG. 5 is replaced with a signal 1114. Similar to the signal 514, the signal 1114 is representative of a gate voltage applied to cause of the resistance of the current dissipation path to be sufficiently high to dissipate the negative current from the laser diode 110, starting at time T4. However, because in the laser driver 1020 the gate voltage applied at the time T4 is used to achieve a desired resistance of the current dissipation path 440, the amplitude of the signal 1114 is smaller than the amplitude of the signal 514 to ensure that the resistance of the path 440 is high enough when the switch 1030 is in the third state to be able to dissipate sufficient amount of the current from the laser diode 110. Put differently, the amplitude of the signal 512 is larger than that of the signal 1114 to ensure that the resistance of the path 440 when the switch 1030 is in the first state is low enough to not hinder charging of the main inductor 124.

To summarize the embodiment shown in FIG. 10, the value of the voltage applied to the gate terminal 1032-1 affects the resistance between the source and drain terminals of the switch 1030. Therefore, in the laser system 1000, the value of the voltages applied to the gate terminal 1032-1 when the switch is in the first vs the third state may be modified to control the value of the resistance of the path 440 for using the path 440 to either charging the main inductor 124 or dissipate the current from the laser diode 110. In particular, making the value of the voltage 1114 applied to the gate terminal 1032-1 smaller than the value of the voltage 512 may ensure that the resistance of the path 440 when the switch 1030 is in the third state is higher compared to the resistance of the path 440 when the switch 1030 is in the first state.

In various embodiments of the laser system 1000, the switch 1030 may be implemented as a FET (e.g., a MOSFET), a bipolar transistor, or a p-i-n diode. In various embodiments, the switch 1030 may be implemented either as an N-type transistor or as a P-type transistor. In some embodiments, the switch 1030 may be implemented as a III-N transistor, e.g., as a GaN transistor.

Figure 12:
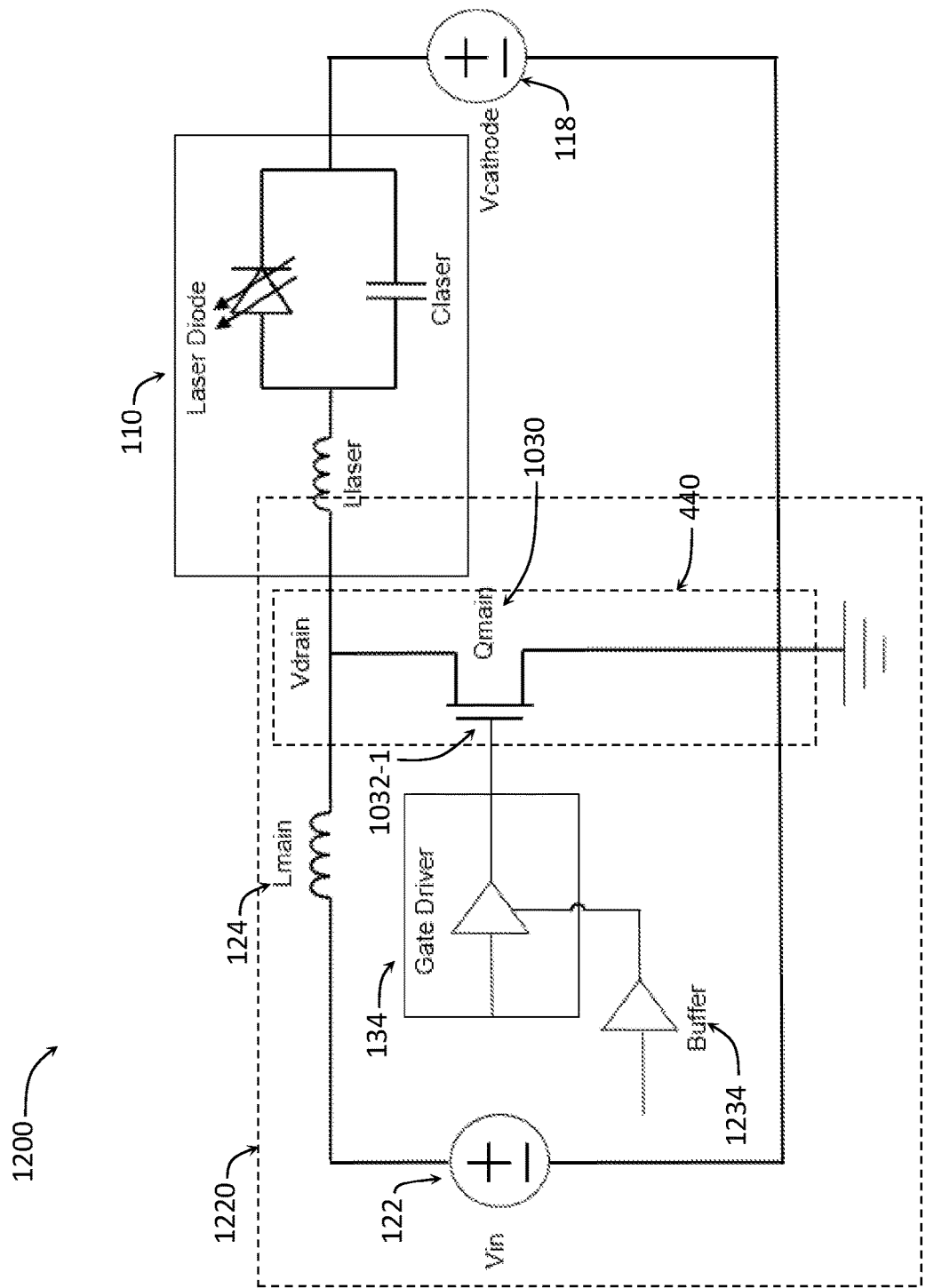
FIG. 12 is a schematic diagram of a laser system with a laser driver without a designated current dissipation path and with a buffer, according to some embodiments of the present disclosure.

Next, turning to a second example embodiment of a laser driver design of the second group, FIG. 12 is a schematic diagram of a laser system 1200 with a laser driver 1220 without a designated current dissipation path, according to some embodiments of the present disclosure. The laser system 1200 is similar to that shown in FIG. 10, where elements of FIG. 12 having the same reference numerals as those shown in FIG. 10 intend to illustrate similar or analogous components so that, in the interests of brevity, their descriptions are not repeated. Instead, the differences of FIG. 12 with respect to FIG. 10 are described.

As shown in FIG. 12, the laser system 1200 includes a laser driver 1220. Similar to the laser driver 1020, the laser driver 1220 is coupled to the laser diode 110, and includes some of the elements shown in FIG. 10, where, in order to not clutter the drawings, FIG. 12 does not explicitly provide reference numerals for the individual elements of the laser driver 110. In particular, FIG. 12 illustrates the main switch 1030, which may be in one of three states, as described with reference to FIG. 10. In contrast to FIG. 10, the laser driver 1220 of FIG. 12 does not include a second gate driver that is coupled to the switch 1030 in addition to the gate driver 134 (i.e., FIG. 12 does not include the second gate driver 1034, shown in FIG. 10). Instead, the laser driver 1220 includes a buffer 1234, coupled to the gate driver 134. The gate driver 134 and the buffer 1234 are configured to manipulate the resistance for dissipating current, similar to FIG. 8 except that it is the resistance of a single path, namely, the path 440, that is manipulated to either be low enough to charge the main inductor 124 in the time period between the times T1 and T2, as described above, or to dissipate the negative current from the laser diode 110 in the time period between the times T4 and T6, also described above.

The buffer 1234 may be used to control one of the logic states of the gate driver 134. For example, the buffer 1234 may be used to control gate driver logic low value. When buffer input is logic low, its output will be ground, then gate driver output will be supply or ground according to its input signal. When buffer input is logic high, its output will be its supply voltage $VDD_{INV}$, then gate driver output will be low its output will be buffer's supply voltage. In this manner, it is possible to drive the switch 1030 to be in one of the three states, described with reference to FIG. 10, with only one gate driver (i.e., the gate driver 134) and one buffer (i.e., the buffer 1234).

Figure 13:
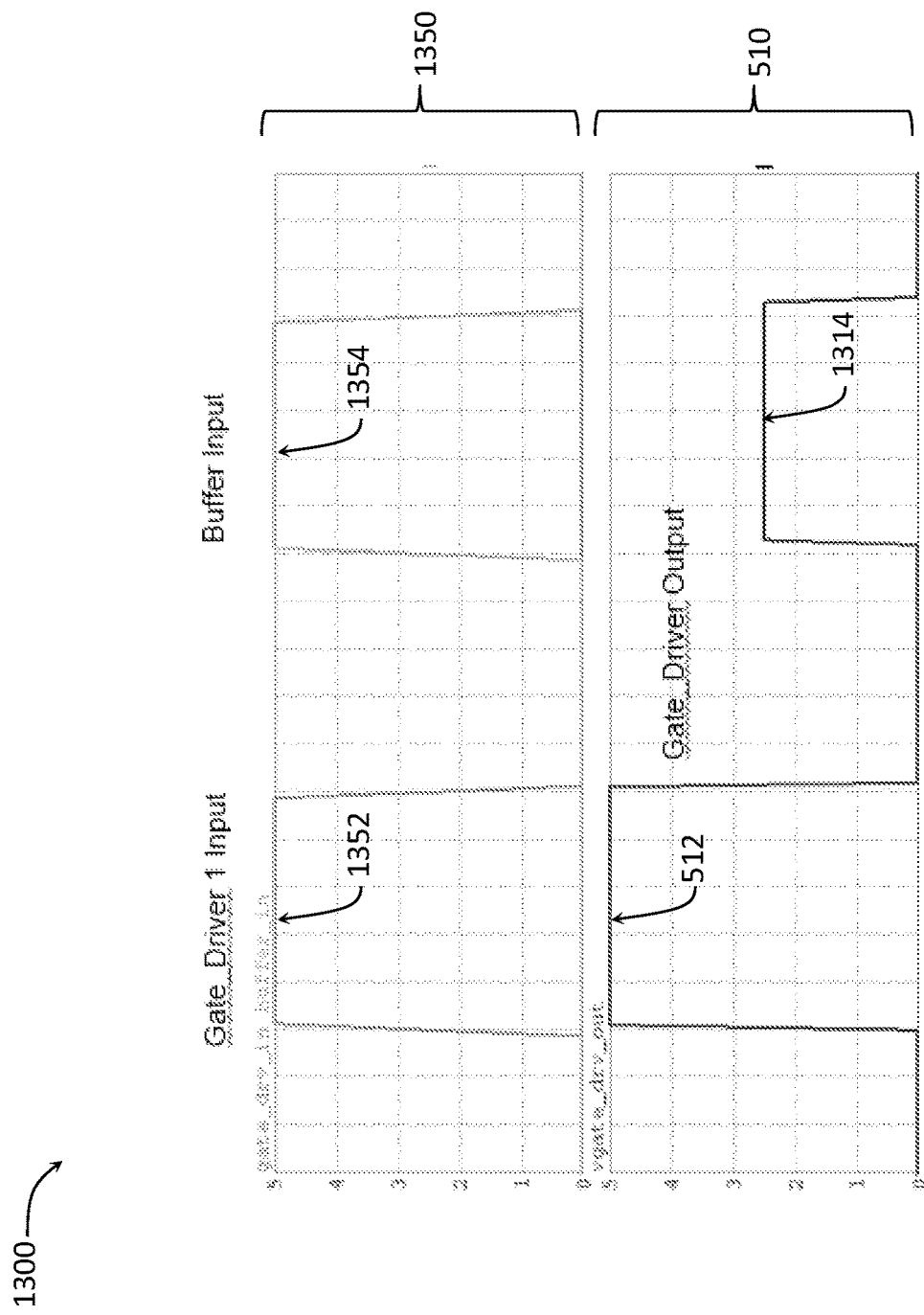
FIG. 13 is an example timing diagram for the system shown in FIG. 12, according to some embodiments of the present disclosure.

The timing of the gate operations of the laser system 1200 may be described with reference to a timing diagram shown in FIG. 13. The timing diagram 1300 illustrates the section 510, similar to that shown in FIG. 5 (sections 520, 530, and 540 are not shown in the interests of brevity). The timing diagram 1300 illustrates the signal 512, which may be analogous to that described with reference to FIG. 5. What is different in FIG. 13 is that the signal 514 shown in FIG. 5 is replaced with a signal 1314. Similar to the signal 514, the signal 1314 is representative of a gate voltage applied to cause of the resistance of the current dissipation path to be sufficiently high to dissipate the negative current from the laser diode 110, starting at time T4. However, because in the laser driver 1220 the gate voltage applied at the time T4 is used to achieve a desired resistance of the current dissipation path 440, the amplitude of the signal 1314 is smaller than the amplitude of the signal 514 shown in FIG. 5 to ensure that the resistance of the path 440 is high enough when the switch 1030 of the laser driver 1220 is in the third state to be able to dissipate sufficient amount of the current from the laser diode 110. Put differently, the amplitude of the signal 512 is larger than that of the signal 1314 to ensure that, in the laser driver 1220, the resistance of the path 440 when the switch 1030 is in the first state is low enough to not hinder charging of the main inductor 124. While the section 510 illustrates in FIG. 13 the output of the gate driver 134 of the laser driver 1220, a section 1350, also shown in FIG. 13, illustrates input to the gate driver 134 of the laser driver 1220, showing a signal 1352 and a signal 1354, described below.

The switch 1030 may be put in the first state by the gate driver 134 applying a suitable voltage to the gate terminal 1032-1 to enable current to flow between the source and drain terminals of the switch 1030 and the resistance of the path 440 being sufficiently low to not hinder charging of the main inductor 124. The switch 1030 may be in the first state between times T1 and T2, described above, and the descriptions provided above with respect to charging the main inductor 124 are applicable to the switch 1030 in its' first state. For example, the gate driver 134 may open the gate of the main transistor 1030 with maximum gate-source voltage (VGS), then close it with zero VGS voltage. To put the switch 1030 in the first state, the logic state of the buffer 1234 may be low so that the output of the buffer 1234 may be ground, and the output of the gate driver 134 will be either supply or ground, according to the input signal to the gate driver 134. This is illustrated in FIG. 13 with the input to the gate driver 134 being the signal 1352 between the times T1 and T2, and the buffer input signal 1354 being low.

The switch 1030 may be put in the second state by the gate driver 134 applying a suitable voltage (including applying a zero voltage) to the gate terminal 1032-1 to ensure that no current flows between the source and drain terminals of the switch 1030 and the path 440 is deactivated. This is illustrated in FIG. 13 with both the gate driver input signal 1352 and the buffer input signal 1354 being low between the times T2 and T4. The switch 1030 of the laser driver 1200 may be in the second state between times T2 and T4, described above, and the descriptions provided above with respect to discharging the main inductor 124 and the current pulse provided to the laser diode 110 at time T3 to cause emission of a laser pulse are applicable to the switch 1030 in its' second state.

After a delay, the gate 1032-1 of the Qmain may be driven to different VGS, and the switch 1030 may be put in the third state, where the different VGS is defined by the supply voltage of the buffer 1234. For example, the switch 1030 may be put in the third state by switching the logic state of the buffer 1234. This is illustrated in FIG. 13 with the input to the gate driver 134 being low and the buffer input signal 1354 being high between the times T4 and T6. For example, the buffer 1234 may be activated (e.g., by providing buffer input logic high to the buffer 1234), in which case the output of the buffer 1234 may be its supply voltage $VDD_{INV}$, and the output of the gate driver 134 will be low and its output will be buffer's supply voltage, as shown in FIG. 13 with the gate driver output 1314. The output 1314 of the gate driver 134 provides a suitable voltage to the gate terminal 1032-1 to enable current to flow between the source and drain terminals of the switch 1030 but so that the resistance of the path 440 is sufficiently high to enable dissipation of the negative current from the laser diode 110 by the path 440. The switch 1030 may be in the third state between times T4 and T6, described above, and the descriptions provided above with respect to dissipating the negative current are applicable to the switch 1030 in its' third state. In some embodiments, the resistance of the path 440 when the switch 1030 is in the third state may be at least 2 times higher, e.g., at least 4 times higher or at least 8 times higher, than the resistance of the path 440 when the switch 1030 is in the first state, but lower than the resistance of the path 440 when the switch 1030 is in the second state.

In some embodiments, the gate voltage applied to the switch 1030 by the gate driver 134 when the switch 1030 is in the third state (i.e., the gate voltage defined by the output 1314, shown in FIG. 13) may be lower than the gate voltage applied to the switch 1030 by the gate driver 134 when the switch 1030 is in the first state (i.e., the gate voltage defined by the output 512, shown in FIG. 13), to ensure that the resistance of the path when the switch 1030 is in the third state is higher than the resistance of the path when the switch 1030. This is illustrated in FIG. 13 with the output 512 having higher amplitude than the output 1314. The absolute value of the amplitude of the voltage applied to the gate terminal 1032-1 when the switch 1030 of the laser driver 1220 is in the third state should such as to turn on/activate the current dissipation path 440 to dissipate the negative current from the laser diode 110 between the times T4 and T6, as was described with reference to FIG. 10.

To summarize the embodiment shown in FIG. 12, similar to the embodiment shown in FIG. 10, the value of the voltage applied to the gate terminal 1032-1 of the laser driver 1220 affects the resistance between the source and drain terminals of the switch 1030. Therefore, in the laser system 1200, the value of the voltages applied to the gate terminal 1032-1 when the switch is in the first vs the third state may be modified to control the value of the resistance of the path 440 for using the path 440 to either charging the main inductor 124 or dissipate the current from the laser diode 110. In particular, making the value of the voltage 1114 applied to the gate terminal 1032-1 of the laser system 1200 smaller than the value of the voltage 512 may ensure that the resistance of the path 440 when the switch 1030 is in the third state is higher compared to the resistance of the path 440 when the switch 1030 is in the first state.

Further Variations

Figure 14:
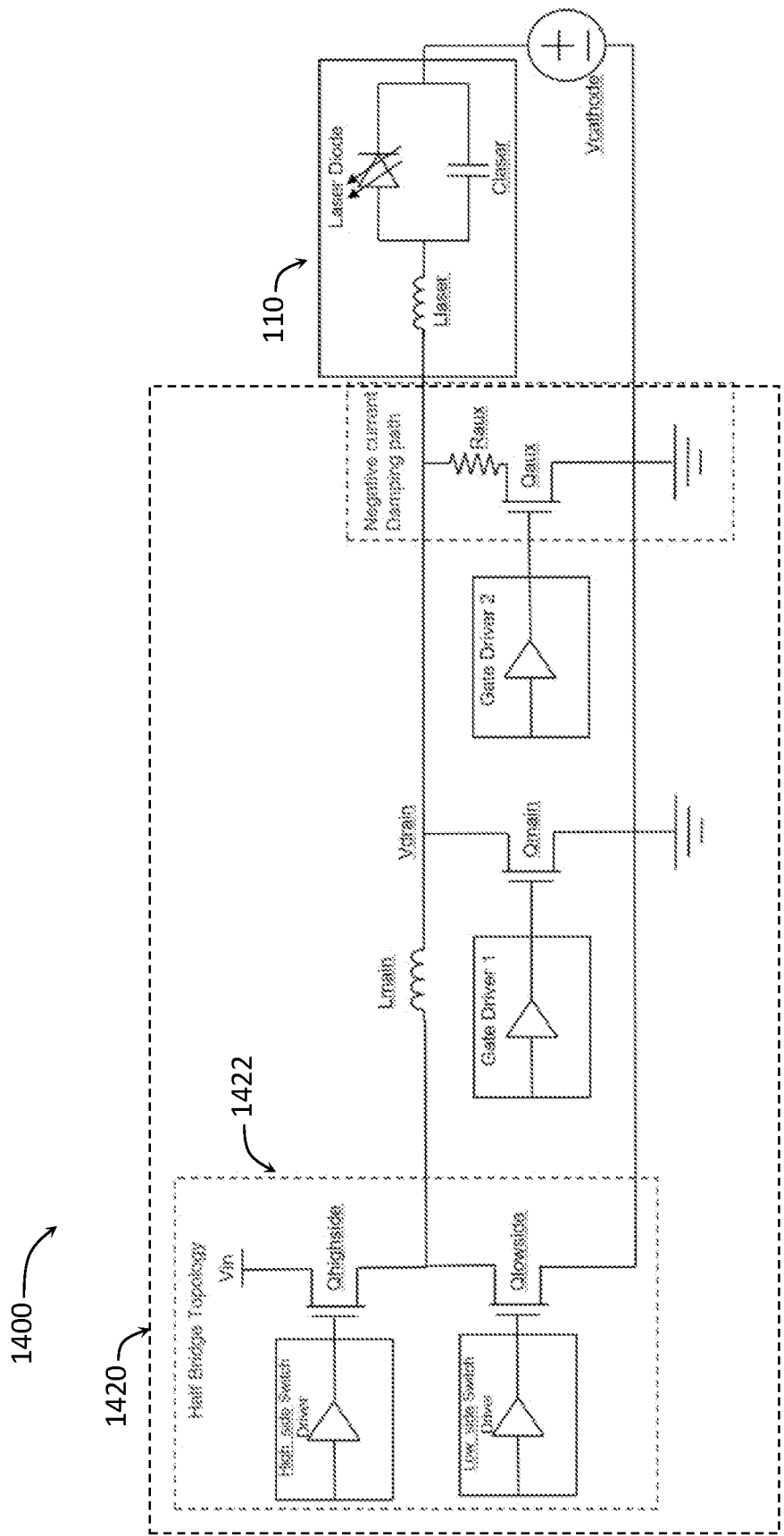
FIG. 14 is a schematic diagram of a using a half-bridge circuit in a laser system with a laser driver, according to some embodiments of the present disclosure.

FIG. 14 is a schematic diagram of a using a half-bridge circuit in a laser system with a laser driver, according to some embodiments of the present disclosure. In particular, FIG. 14 illustrates a laser system 1400 which is the same as the laser system 400 shown in FIG. 4, except that the voltage source 142 is replaced with a half-bridge circuit 1422. Although not specifically shown in the present figures, further embodiments of the laser systems described with reference to FIGS. 6, 8, 10, and 12 may also include such a modification. Such a modification may be particularly advantageous for the switching capability of the voltage supply (Vin) and being able to connect the main inductor left side to ground when needed. Specifically, the switch labeled in FIG. 14 as "Qhighside" can be set to an ON state (while the switch "Qlowside" may be set to an OFF state) during the time when the inductor Lmain is supposed to be charged. Once the inductor Lmain is charged at a desired amount, the switch Qhighside can be set to an OFF state and the switch Qlowside may be set to an ON state so that no additional charge is supplied from Vin to Lmain. The ON-OFF timing implementations provided for various embodiments above are applicable to this topology as well.

In various embodiments, two or more components of the laser systems described with reference to FIGS. 4, 6, 8, 10, 12, and 14 may be implemented on a single die. In other embodiments, at least some of the components of the laser systems described with reference to FIGS. 4, 6, 8, 10, 12, and 14 may be implemented on different dies.

Example Systems Implementing Laser Drivers with Current Dissipation Paths

Figure 15:
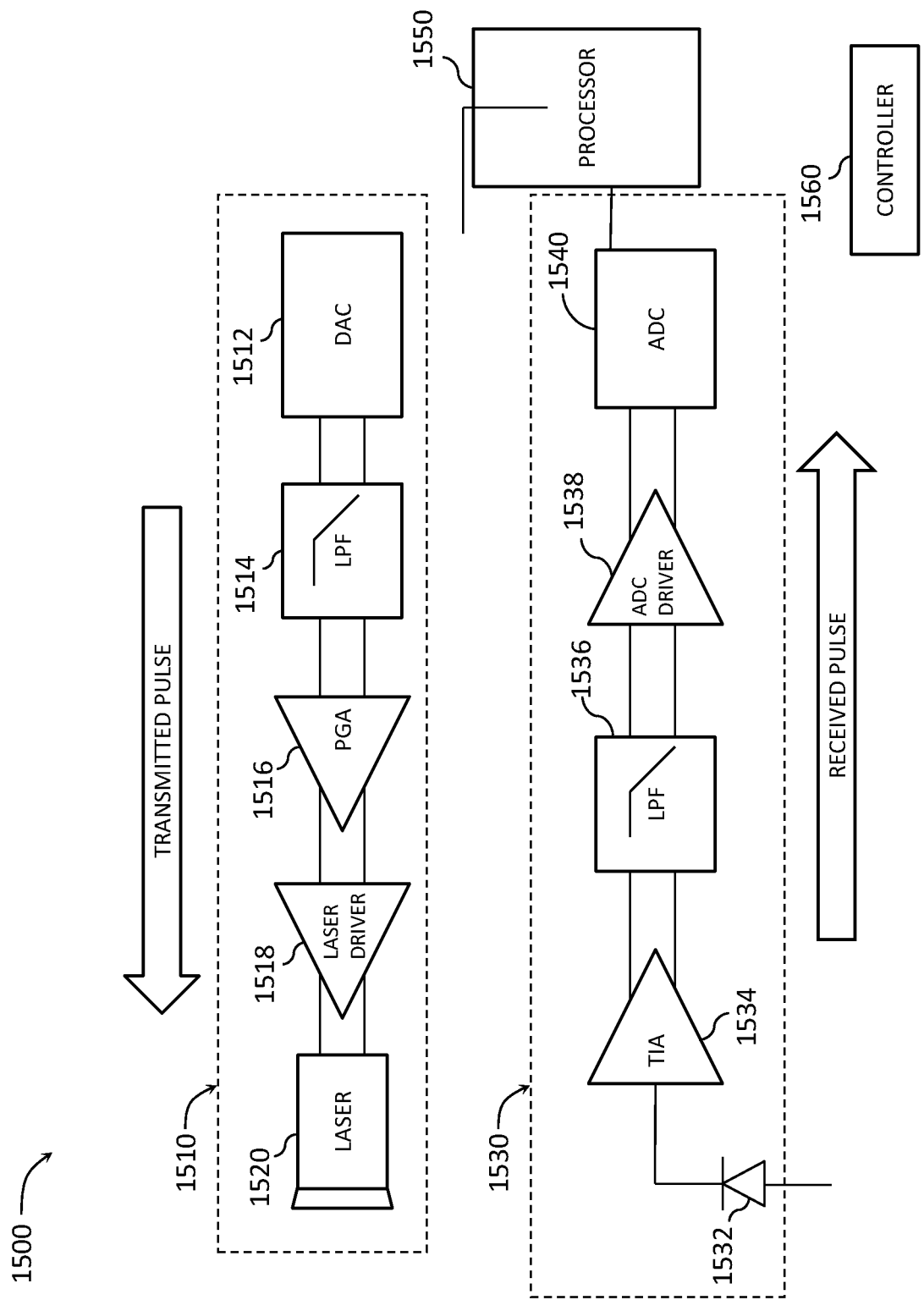
FIG. 15 is a block diagram of an example LIDAR system, according to some embodiments of the present disclosure.

FIG. 15 is a block diagram of an example laser range finding, e.g., LIDAR, system 1500 according to some embodiments of the present disclosure. As shown in FIG. 15, system 1500 may include a transmitter signal chain 1510, a receiver signal chain 1530, a processor 1550, and a controller 1560. In some instances, the receiver signal chain 1530 can be implemented separately from the transmitter signal chain 1510. As shown in FIG. 15, the transmitter signal chain 1512 may include a digital-to-analog converter (DAC) 1512, a low pass filter (LPF) 1514, a programmable gain amplifier (PGA) 1516, a laser driver 1518, and a laser 1520. The receiver chain 1530 may include an optical sensor, e.g., a photodiode (PD) 1532, a transimpedance amplifier (TIA) 1534, an LPF 1536, an analog-to-digital converter (ADC) driver 1538, and an ADC 1540. In some instances, a receiver chain can include a PGA coupled between the TIA 1534 and the LPF 1536. Such a PGA could be implemented in place of or in addition to the ADC driver 1538.

The processor 1550 may be configured to generate a digital signal indicating that a laser pulse is to be emitted by the laser 1520. The digital signal from the processor 1550 may then be converted to an analog signal by the DAC 1512, further processed by the optional LPF 1514, amplified by the PGA 1516, and provided to the laser driver 1518. The laser driver 1518 may include any embodiment of the laser drivers with negative current dissipation paths as described herein, e.g., any embodiment of the laser driver described with reference to FIGS. 4, 6, 8, 10, and 12. The laser 1520 may be the laser diode 110 as described herein.

The light emitted by the laser 1520 can reach an object or a target and reflected light can be received by the optical sensor 1532 of the receiver signal chain 1530. Thus, the reflected light can be detected at the optical sensor 1532. The optical sensor 1532 can be an avalanche photodiode (APD), for example. The optical sensor 1532 can generate a current pulse indicative of the received reflected light and the current pulse may be converted to a voltage pulse by the TIA 1534 and, optionally, further processed by the LPF 1536. The LPF 1536 can be a tunable filter in certain embodiments. As illustrated, the LPF 1536 may be coupled in a signal path between the TIA 1534 and the ADC driver 1538. In some other implementations, the LPF 1536 can be coupled in a signal path between the ADC driver 1538 and the ADC 1540. The ADC driver 1538 generate a drive signal, based on the output of the TIA 1534, to drive the ADC 1540. The ADC 1540 can convert the received drive signal to a digital signal, to further be processed by the processor 1550.

In some embodiments, the processor 1550 can be a hardware processor. In some embodiments, the processor 1550 can be a baseband digital signal processor. In some embodiments, the processor 1550 can determine a distance between an object and the laser range finding system 1500. In some embodiments, the processor 1550 can output a signal indicative of the determined distance. In some embodiments, the processor 1550 can identify an object from which the pulse of light reflected from the object based at least partly on the width of a pulse generated by the TIA 1534. In some embodiments, the processor 1550 can output data identifying the object. In some embodiments, one instance of the processor 1550 may be associated with the receiver signal chain 1530 and another instance of the processor 1550 may be associated with the transmitter signal chain 1510.

The controller 1560 may be used to control when the current dissipation path is activated (i.e., provides the resistance to dissipate the negative current from the laser diode) and when it is deactivated (i.e., does not provide the resistance to dissipate the negative current from the laser diode). For example, the controller 1560 may generate control signals that control operation of various elements of the laser systems with current dissipation paths as described herein. In some embodiments, the controller 1560 may be implemented as a data processing system shown in FIG. 16.

Figure 16:
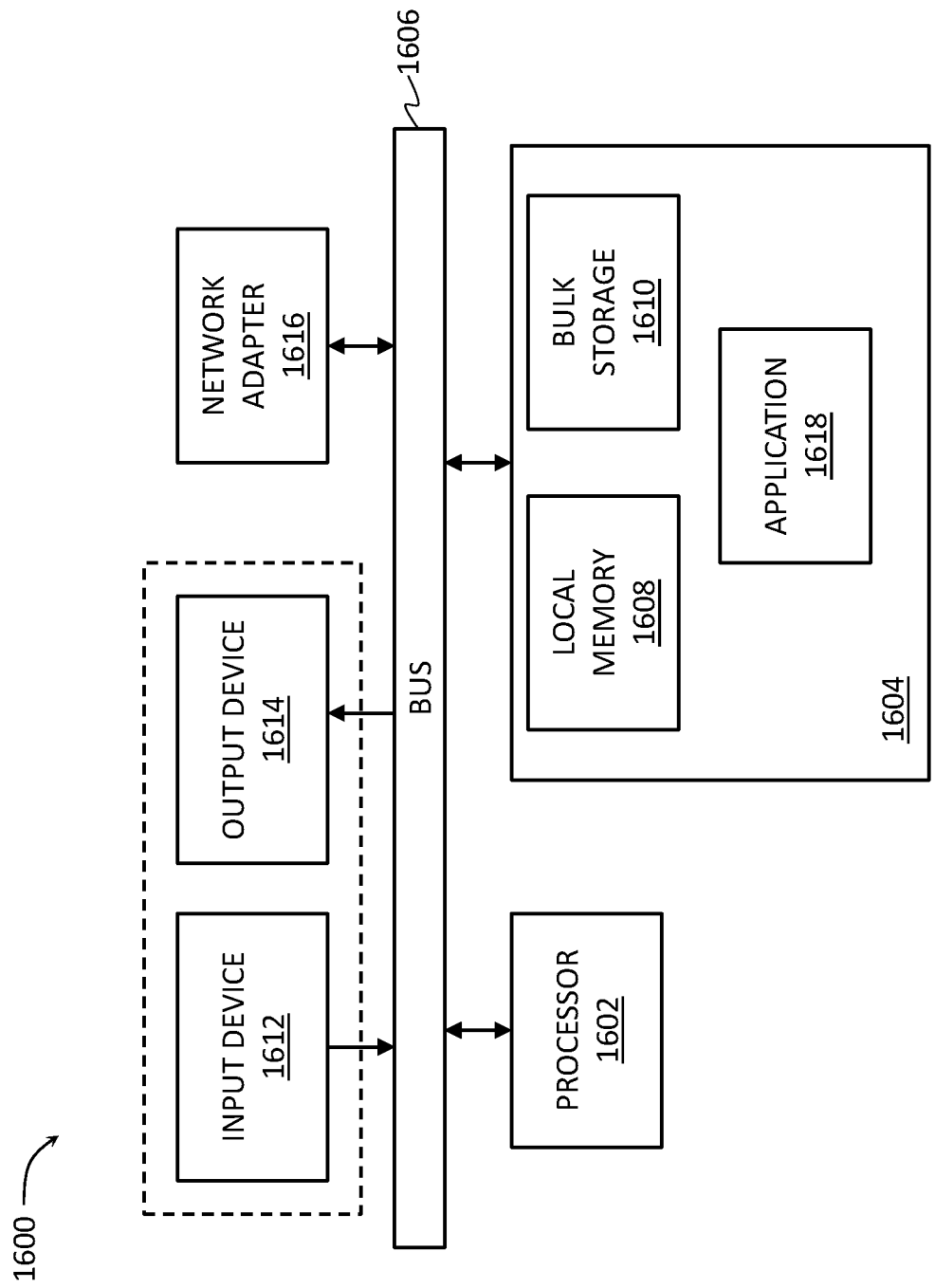
FIG. 16 provides a block diagram illustrating an example data processing system that may be configured to implement, or control, at least portions of causing a laser diode to emit a laser pulse while implementing a current dissipation path, according to some embodiments of the present disclosure.

FIG. 16 provides a block diagram illustrating an example data processing system 1600 that may be configured to implement, or control, at least portions of causing a laser diode to emit a laser pulse while implementing a current dissipation path, according to some embodiments of the present disclosure. For example, in some embodiments, the data processing system 1600 may be configure to control functionality of one of more of the gate drivers and the switches described herein with reference to FIGS. 4-12. In some embodiments, the controller 1560 may be implemented as the data processing system 1600.

As shown in FIG. 16, the data processing system 1600 may include at least one processor 1602, e.g. a hardware processor 1602, coupled to memory elements 1604 through a system bus 1606. As such, the data processing system may store program code within memory elements 1604. Further, the processor 1602 may execute the program code accessed from the memory elements 1604 via a system bus 1606. In one aspect, the data processing system may be implemented as a computer that is suitable for storing and/or executing program code. It should be appreciated, however, that the data processing system 1600 may be implemented in the form of any system including a processor and a memory that is capable of performing the functions described within this disclosure.

In some embodiments, the processor 1602 can execute software or an algorithm to perform the activities as discussed in this specification, in particular activities related to causing a laser diode to emit a laser pulse while implementing a current dissipation path as described herein. The processor 1602 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 1602 may be communicatively coupled to the memory element 1604, for example in a direct-memory access (DMA) configuration, so that the processor 1602 may read from or write to the memory elements 1604.

In general, the memory elements 1604 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 1600 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in FIGS. 4-12, can also include suitable interfaces for receiving, transmitting, and/or otherwise communicating data or information in a network environment so that they can communicate with, e.g., the data processing system 1600 of another one of these elements.

In certain example implementations, mechanisms for causing a laser diode to emit a laser pulse while implementing a current dissipation path as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 1604 shown in FIG. 16, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 1602 shown in FIG. 16, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 1604 may include one or more physical memory devices such as, for example, local memory 1608 and one or more bulk storage devices 1610. The local memory may refer to RAM or other non-persistent memory device(s) generally used during actual execution of the program code. A bulk storage device may be implemented as a hard drive or other persistent data storage device. The processing system 1600 may also include one or more cache memories (not shown) that provide temporary storage of at least some program code in order to reduce the number of times program code must be retrieved from the bulk storage device 1610 during execution.

As shown in FIG. 16, the memory elements 1604 may store an application 1618. In various embodiments, the application 1618 may be stored in the local memory 1608, the one or more bulk storage devices 1610, or apart from the local memory and the bulk storage devices. It should be appreciated that the data processing system 1600 may further execute an operating system (not shown in FIG. 16) that can facilitate execution of the application 1618. The application 1618, being implemented in the form of executable program code, can be executed by the data processing system 1600, e.g., by the processor 1602. Responsive to executing the application, the data processing system 1600 may be configured to perform one or more operations or method steps described herein.

Input/output (I/O) devices depicted as an input device 1612 and an output device 1614, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 1614 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 1614. Input and/or output devices 1612, 1614 may be coupled to the data processing system either directly or through intervening I/O controllers.

In an embodiment, the input and the output devices may be implemented as a combined input/output device (illustrated in FIG. 16 with a dashed line surrounding the input device 1612 and the output device 1614). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 1616 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1600, and a data transmitter for transmitting data from the data processing system 1600 to said systems, devices and/or networks. Modems, cable modems, and Ethernet cards are examples of different types of network adapter that may be used with the data processing system 1600.

Figure 17:
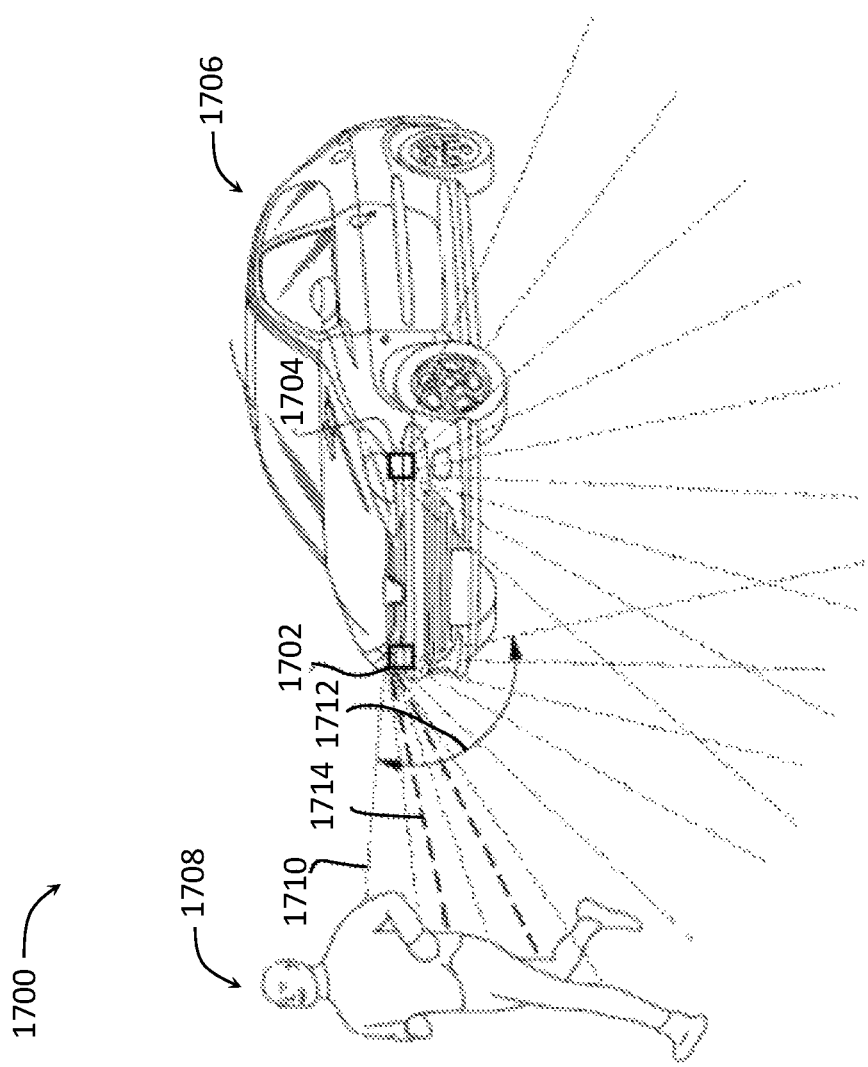
FIG. 17 is an example illustration of a LIDAR system integrated with an automobile, according to some embodiments of the present disclosure.

FIG. 17 shows a LIDAR system integrated with an automobile. This is an example application in which laser systems discussed herein can be implemented. FIG. 17 illustrates two LIDAR systems 1702 and 1704 integrated with an automobile 1706. The first LIDAR system 1702 may be positioned near a right headlight of the automobile 1706 and the second LIDAR system 1704 may be positioned near the left headlight of automobile 1706. The LIDAR systems 1702 and/or 1704 can implement any suitable principles of the laser drivers with a current dissipation path, as discussed herein. The LIDAR systems 1702 and/or 1704 can detect a distance between the automobile 1706 and an object 1708.

As illustrated, a transmitter of the LIDAR system 1702 can transmit pulses of light 1710 at an angle 1712. At least some of the pulses of light 1710 may be generated by a laser diode, e.g., the laser diode 110, driven by any embodiment of the laser drivers with a current dissipation path as described herein. The transmitted light 1710 can travel through the air and reach the object 1708. The object 1708 can reflect back pulses of light 1714 to a receiver of the LIDAR system 1702. Embodiments discussed herein can generate information to identify the object 1708. The pulses of light 1710 can be transmitted three dimensionally to obtain three dimensional information of the surroundings.

One or more additional LIDAR systems can be integrated with the automobile 1706 to cover a wider range of area for detection and/or to obtain additional information regarding a selected area. In some embodiments, data collected by each LIDAR system can be combined to analyze information from a wider range of area and/or to provide additional information about a selected area. In some embodiments, the angle 1712 can be adjusted and the angle 1712 can be in any suitable range.

SELECT EXAMPLES

Example 1 provides a laser driver configured to drive a laser diode, the laser driver including a switch, an inductor, and a current dissipation path. The switch is configured to be in one of a plurality of states, the plurality of states including at least a first state and a second state. The inductor is configured to be charged when the switch is in the first state and configured to provide a current pulse to the laser diode to cause the laser diode to emit an optical pulse when the switch is in the second state, the current being based on (i.e., the current corresponding to, or being dependent on) a charge on the inductor. The current dissipation path is configured to start providing a resistance for dissipating at least a portion (but preferably substantially all of) a current from (i.e., provided by, or flowing from) the laser diode (i.e., a negative current because this current moves away from the laser diode) when the switch is in the second state and at least 90% of the current pulse has been provided to the laser diode.

Example 2 provides the laser driver according to example 1, where the switch is a first switch, the current dissipation path includes a second switch configured to be in one of the plurality of states (i.e., the same first and second states as defined for the first switch), the current dissipation path is in electrical parallel with the first switch, and the current dissipation path is configured to start providing the resistance for dissipating the portion the current from the laser diode when the second switch is placed in the first state.

Example 3 provides the laser driver according to example 2, where the second switch is in the second state (and, therefore, the current dissipation path does not provide the resistance for dissipating current) for a duration of time when the first switch is in the first state and for a duration of time when the at least 90% of the current pulse is being provided to the laser diode.

Example 4 provides the laser driver according to examples 2 or 3, where the current dissipation path includes a resistor connected in electrical series with the second switch.

Example 5 provides the laser driver according to example 4, where the resistance provided by the current dissipation path (which resistance includes a resistance of the resistor connected in electrical series with the second switch) is at least 2 times higher, e.g., at least 4 times higher or at least 8 times higher, than a resistance of a path that includes the first switch.

Example 6 provides the laser driver according to examples 4 or 5, where each of the first switch and the second switch is a device that includes a first terminal, a second terminal, and a third terminal, the first switch is in the first state when a first voltage is applied to the first terminal of the first switch and current is conducted between the second terminal of the first switch and the third terminal of the first switch, the first switch is in the second state when a second voltage, different from the first voltage, is applied to the first terminal of the first switch, the second switch is in the first state when a third voltage is applied to the first terminal of the second switch and current is conducted between the second terminal of the second switch and the third terminal of the second switch, and the second switch is in the second state when a fourth voltage, different from the third voltage, is applied to the first terminal of the second switch.

Example 7 provides the laser driver according to example 6, where the first voltage is applied to the first terminal of the first switch by a first driver, and the third voltage is applied to the first terminal of the second switch by a second driver, the second driver being a different driver than the first driver. In some such embodiments, the first and the third voltages may be substantially equal. In other such embodiments, the first and the third voltages may be different.

Example 8 provides the laser driver according to example 6, where the first voltage is applied to the first terminal of the first switch by a driver, and the laser driver further includes a delay element, coupled between an output of the driver and the first terminal of the second switch, and configured to apply the third voltage to the first terminal of the second switch by delaying application of the first voltage applied to the first terminal of the first switch to the first terminal of the second switch.

Example 9 provides the laser driver according to examples 2 or 3, where each of the first switch and the second switch is a device that includes a first terminal, a second terminal, and a third terminal, the first switch is in the first state when a first voltage is applied to the first terminal of the first switch and current is conducted between the second terminal of the first switch and the third terminal of the first switch, the first switch is in the second state when a second voltage, different from the first voltage, is applied to the first terminal of the first switch, the second switch is in the first state when a third voltage, smaller than the first voltage (in absolute values) but not a zero voltage, is applied to the first terminal of the second switch and current is conducted between the second terminal of the second switch and the third terminal of the second switch, and the second switch is in the second state when a fourth voltage, different from the third voltage, is applied to the first terminal of the second switch.

Example 10 provides the laser driver according to example 9, where the first voltage is applied to the first terminal of the first switch by a first driver, and the third voltage is applied to the first terminal of the second switch by a second driver, the second driver being a different driver than the first driver.

Example 11 provides a laser driver configured to drive a laser diode, the laser driver including an inductor, and a switch, configured to be in one of a plurality of states, the plurality of states including at least a first state, a second state, and a third state. The switch is configured to be in the first state to charge the inductor. The switch is configured to be in the second state to provide current from the inductor to the laser diode to cause the laser diode to emit an optical pulse, the current provided to the laser diode being based on (i.e., the current corresponding to, or being dependent on) a charge on the inductor. The switch is configured to be in the third state to provide a resistance for dissipating at least a portion (but preferably substantially all of) a current from (i.e., provided by, or flowing from) the laser diode (i.e., a negative current because this current moves away from the laser diode).

Example 12 provides the laser driver according to example 11, where the switch is placed in the third state when at least 90% of the current has been provided to the laser diode.

Example 13 provides the laser driver according to examples 11 or 12, where the switch is a transistor that includes a first terminal, a second terminal, and a third terminal, the switch is in the first state when a first voltage is applied to the first terminal of the switch and a resistance between the second and the third terminals of the switch is a first resistance, the switch is in the second state when substantially no current is conducted between the second terminal and the third terminal of the switch (i.e., the second state of the switch is that the switch is off, which can be when either no voltage is applied to the first terminal of the switch or that the voltage applied is sufficiently low that the switch is in the cutoff mode), and the switch is in the third state when a second voltage is applied to the first terminal of the switch and a resistance between the second and the third terminals of the switch is a second resistance, the second resistant being higher than the first resistance.

Example 14 provides the laser driver according to example 13, where the second resistance is at least 2 times higher, e.g., at least 4 times higher or at least 8 times higher, than the first resistance.

Example 15 provides the laser driver according to examples 13 or 14, where an absolute value of the second voltage is smaller than an absolute value of the first voltage (in absolute values) and is equal to or larger than a threshold voltage (i.e., the turn-on voltage) of the transistor.

Example 16 provides the laser driver according to any one of the preceding examples, further including a voltage source (Vin) coupled to the inductor, the voltage source including a half-bridge circuit.

Example 17 provides a method of operating a laser driver that includes an inductor, a first switch included in a first path coupled to the inductor, and a second switch included in a second path coupled to the inductor, where the first path is in electrical parallel to the second path, each of the first switch and the second switch includes a first terminal and a second terminal, and each of the first switch and the second switch is either in a first state where substantially no current is conducted between the first terminal and the second terminal, or in a second state where current is conducted between the first terminal and the second terminal. The method includes ensuring that the first switch is in the first state and the second switch is in the second state to charge the inductor to hold a target charge, and, after the inductor has been charged to the target charge, placing the first switch in the second state to enable a laser diode, coupled to the inductor, to receive a current pulse from the inductor and to emit a laser pulse based on the current received from the inductor. The method further includes, after at least 90% of a duration of the current pulse has elapsed (or after the entire duration of the current pulse has elapsed), placing the second switch in the first state (i.e., the second switch was in the second state until this time), while keeping the first switch in the second state, to dissipate, in the second path, at least a portion (but preferably substantially all of) a current from (i.e., provided by, or flowing from) the laser diode (i.e., a negative current because this current moves away from the laser diode).

Example 18 provides the method according to example 17, where the second path includes a resistor in series with the second switch.

Example 19 provides the method according to examples 17 or 18, where a resistance of the second path, when the second switch is in the first state, is at least 2 times higher, e.g., at least 4 times higher or at least 8 times higher, than a resistance of the first path, when the first switch is in the first state.

Example 20 provides the method according to any one of examples 17-19, where the method includes placing the second switch in the first state before 110% of the duration of the current pulse has elapsed.

Example 21 provides the method according to any one of examples 17-20, where the laser driver is a laser driver according to any one of the preceding examples.

Example 22 provides the method according to any one of examples 17-21, where the method further includes operations to operate a laser driver according to any one of the preceding examples.

Example 23 provides a laser system, including a laser diode and further including a laser driver according to any one of the preceding examples.

Example 24 provides the laser system according to example 23, where the laser system is included in, e.g., as a transmitter of, a light detection and ranging (LIDAR) system.

Example 25 provides a vehicle (e.g., an automobile, a plane, or a drone), including the laser system according to examples 23 or 24.

Other Implementation Notes, Variations, and Applications

Principles and advantages discussed herein can be used in any device where a laser diode is driven to generate a laser pulse. For example, aspects of this disclosure can be implemented in various range finding systems. For example, aspects of this disclosure can be implemented in any suitable LIDAR system such as, for example, automotive LIDAR, industrial LIDAR, space LIDAR, military LIDAR, etc. LIDAR systems can include a receiver or a transmitter and a receiver. LIDAR systems can be integrated with a vehicle, such as an automobile, a drone such as an unmanned flying machine, an autonomous robot, or a space vehicle. LIDAR systems can transmit and/o receive laser light. LIDAR systems can be used for three-dimensional sensing applications. LIDAR systems can be used with augmented reality technology. Moreover, aspects of this disclosure can be implemented in various electronic devices. Examples of the electronic devices can include, but are not limited to, electronic products, parts of electronic products such as integrated circuits, vehicular electronics such as automotive electronics, etc. Further, the electronic devices can include unfinished products.

While certain embodiments have been described, these embodiments have been presented by way of example, and are not intended to limit the scope of the disclosure. For example, while some embodiments refer to an APD being coupled to an input port of a TIA, these embodiments are equally applicable to any other device that can generate current pulses to be provided to an input of a TIA, e.g., to any other type of an optical sensor. In another example, while some embodiments refer to a PD that sinks current from the TIA, these embodiments may be modified, in a way that would be obvious to a person of ordinary skill in the art, to a PD that sources current to the TIA, all of which embodiments being, therefore, within the scope of the present disclosure. Indeed, the novel methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, controllers for configuring any of the components, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the present drawings may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the present drawings and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

The invention claimed is:

1. A laser driver to drive a laser diode, the laser driver comprising:
   a first switch and a second switch, each to be in one of a plurality of states, the plurality of states including a first state and a second state; and
   an inductor, to provide a current pulse to the laser diode when the first switch is in the second state, the current being based on a charge on the inductor,
   wherein:
      each of the first switch, the second switch, and the inductor includes a first terminal and a second terminal,
      the first terminal of the first switch is directly coupled to the first terminal of the inductor,
      the first terminal of the second switch is directly coupled to a first terminal of a resistor,
      a second terminal of the resistor is directly coupled to the first terminal of the inductor,
      the second terminal of the inductor is coupled to a voltage source,
      the first terminal of the inductor is further coupled to the laser diode,
      the second switch is to be placed in the first state after at least 90% of a duration of the current pulse has elapsed from a start of the current pulse and before 10% of the duration of the current pulse has elapsed from an end of the current pulse, and to remain in the first state for a non-zero time period after the end of the current pulse,
      each time that the second switch is in the first state, the first switch is to be in the second state for an entire duration of the second switch being in the first state, and
      each time that the first switch is in the first state, the second switch is to be in the second state for an entire duration of the first switch being in the first state.

2. The laser driver according to claim 1, wherein a resistance of a path that includes the resistor and the second switch is at least 2 times higher than a resistance of a path that includes the first switch.

3. The laser driver according to claim 1, wherein:
   each of the first switch and the second switch further includes a third terminal,
   the first switch is in the first state when a first voltage is applied to the third terminal of the first switch and current is conducted between the second terminal of the first switch and the first terminal of the first switch,
   the first switch is in the second state when a second voltage, different from the first voltage, is applied to the third terminal of the first switch or when no voltage is applied to the third terminal of the first switch,
   the second switch is in the first state when a third voltage is applied to the third terminal of the second switch and current is conducted between the second terminal of the second switch and the first terminal of the second switch, and
   the second switch is in the second state when a fourth voltage, different from the third voltage, is applied to the third terminal of the second switch or when no voltage is applied to the third terminal of the second switch.

4. The laser driver according to claim 3, further comprising:
   a first driver to apply the first voltage to the third terminal of the first switch, and
   a second driver, different from the first driver, to apply the third voltage to the third terminal of the second switch.

5. The laser driver according to claim 3, further comprising:
   a driver to apply the first voltage to the third terminal of the first switch, and
   a delay element, coupled between an output of the driver and the third terminal of the second switch, to apply the third voltage to the third terminal of the second switch by delaying application of the first voltage applied to the third terminal of the first switch to the third terminal of the second switch.

6. The laser driver according to claim 1, wherein:
   each of the first switch and the second switch further includes a third terminal,
   the first switch is in the first state when a first voltage is applied to the third terminal of the first switch and current is conducted between the second terminal of the first switch and the first terminal of the first switch,
   the first switch is in the second state when a second voltage, different from the first voltage, is applied to the third terminal of the first switch or when no voltage is applied to the third terminal of the first switch,
   the second switch is in the first state when a third voltage, smaller than the first voltage, is applied to the third terminal of the second switch and current is conducted between the second terminal of the second switch and the first terminal of the second switch, and
   the second switch is in the second state when a fourth voltage, different from the third voltage, is applied to the third terminal of the second switch or when no voltage is applied to the third terminal of the second switch.

7. The laser driver according to claim 6, further comprising:
   a first driver to apply the first voltage to the third terminal of the first switch, and
   a second driver, different from the first driver, to apply the third voltage to the third terminal of the second switch.

8. The laser driver according to claim 1, wherein the inductor is to be charged when the first switch is in the first state.

9. A method of operating a laser driver that includes an inductor, a first switch included in a first path coupled to the inductor, and a second switch included in a second path coupled to the inductor, wherein:
   the first path is in electrical parallel to the second path,
   each of the first switch, the second switch, and the inductor includes a first terminal and a second terminal,
   each of the first switch and the second switch is either in a first state where current is conducted between the first terminal and the second terminal, or in a second state where substantially no current is conducted between the first terminal and the second terminal,
   the first terminal of the first switch is directly coupled to the first terminal of the inductor,
   the first terminal of the second switch is directly coupled to a first terminal of a resistor,
   a second terminal of the resistor is directly coupled to the first terminal of the inductor,
   each of the second terminal of the first switch and the second terminal of the second switch is directly coupled to a fixed potential,
   the second terminal of the inductor is coupled to a voltage source, the first terminal of the inductor is further coupled to a laser diode, the method comprising:

ensuring that the first switch is in the first state and the second switch is in the second state while the inductor is charged to hold a target charge;

after the inductor has been charged to the target charge, placing the first switch in the second state to enable the laser diode, coupled to the inductor, to receive a current pulse from the inductor and to emit a laser pulse based on the current received from the inductor;

placing the second switch in the first state after at least 90% of a duration of the current pulse has elapsed from a start of the current pulse and before 10% of the duration of the current pulse has elapsed from an end of the current pulse, and ensuring that the second switch remains in the first state for a non-zero time period after the end of the current pulse;

ensuring that, each time that the second switch is in the first state, the first switch is in the second state for an entire duration of the second switch being in the first state; and ensuring that, each time that the first switch is in the first state, the second switch is in the second state for an entire duration of the first switch being in the first state.

10. The method according to claim 9, wherein the resistor is in series with the second switch.

11. The method according to claim 9, wherein a resistance of the second path when the second switch is in the first state, is at least 2 times higher than a resistance of the first path when the first switch is in the first state.

12. The method according to claim 9, wherein the method includes ensuring that the second switch is in the second state while the first switch is in the first state and before 90% of the duration of the current pulse has elapsed.

13. A system, comprising:

a laser diode; and a laser driver to drive the laser diode, the laser driver including:

a first switch and a second switch, each to be in one of a plurality of states, the plurality of states including a first state and a second state, and an inductor, to provide a current pulse to the laser diode when the first switch is in the second state, the current being based on a charge on the inductor, wherein:

each of the first switch, the second switch, and the inductor includes a first terminal and a second terminal, the first terminal of the first switch is directly coupled to the first terminal of the inductor, the first terminal of the second switch is directly coupled to a first terminal of a resistor, a second terminal of the resistor is directly coupled to the first terminal of the inductor, each of the second terminal of the first switch and the second terminal of the second switch is directly coupled to a fixed potential, the second terminal of the inductor is coupled to a voltage source, the first terminal of the inductor is further coupled to the laser diode, the second switch is to be placed in the first state after at least 90% of a duration of the current pulse has elapsed from a start of the current pulse and before 10% of the duration of the current pulse has elapsed from an end of the current pulse, and to remain in the first state for a non-zero time period after the end of the current pulse, each time that the second switch is in the first state, the first switch is to be in the second state for an entire duration of the second switch being in the first state, and each time that the first switch is in the first state, the second switch is to be in the second state for an entire duration of the first switch being in the first state.

14. The system according to claim 13, wherein the second switch is in the second state for a duration of time when the first switch is in the first state and for a duration of time when at least 90% of the current pulse is being provided to the laser diode.

15. The system according to claim 13, wherein the system is at least one of a light transmitter, a light detection and ranging (LIDAR) system, and a vehicle.

16. The system according to claim 13, wherein:

the first terminal of the second switch is coupled to the first terminal of the inductor.

17. The system according to claim 13, wherein the inductor is to be charged when the first switch is in the first state.

18. The system according to claim 13, wherein a resistance of a path that includes the resistor and the second switch is at least 2 times higher than a resistance of a path that includes the first switch.

\* \* \* \* \*